United States Patent
Shieh et al.

(10) Patent No.: US 8,987,008 B2
(45) Date of Patent: Mar. 24, 2015

(54) INTEGRATED CIRCUIT LAYOUT AND METHOD WITH DOUBLE PATTERNING

(71) Applicant: Taiwan Semiconductor Manufacturing Company, Ltd., Hsin-Chu (TW)

(72) Inventors: Ming-Feng Shieh, Yongkang (TW); Ru-Gun Liu, Zhubei (TW); Hung-Chang Hsieh, Hsin-Chu (TW); Tsai-Sheng Gau, Hsin-Chu (TV); Yao-Ching Ku, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/971,363

(22) Filed: Aug. 20, 2013

(65) Prior Publication Data
US 2015/0056724 A1    Feb. 26, 2015

(51) Int. Cl.
*H01L 21/00* (2006.01)
*H01L 21/308* (2006.01)
*H01L 21/66* (2006.01)

(52) U.S. Cl.
CPC ............ *H01L 21/3083* (2013.01); *H01L 22/12* (2013.01); *Y10S 438/942* (2013.01)
USPC ................. 438/14; 438/942; 716/50; 716/54; 716/55

(58) Field of Classification Search
USPC ............................ 438/14, 942; 716/50, 54, 55
See application file for complete search history.

(56) References Cited

U.S. PATENT DOCUMENTS

| | | | |
|---|---|---|---|
| 7,862,962 B2 | 1/2011 | Shieh et al. | |
| 2008/0008969 A1* | 1/2008 | Zhou et al. | 430/313 |
| 2013/0105948 A1* | 5/2013 | Kewley | 257/618 |
| 2014/0191372 A1* | 7/2014 | Sivakumar et al. | 257/618 |

* cited by examiner

*Primary Examiner* — Asok K Sarkar
(74) *Attorney, Agent, or Firm* — Haynes and Boone, LLP

(57) ABSTRACT

The present disclosure provides one embodiment of a method for an integrated circuit (IC). The method includes forming a mandrel pattern on a substrate by a first lithography process; forming a first spacer pattern on sidewalls of the mandrel pattern; removing the mandrel pattern; forming a second spacer pattern on sidewalls of the first spacer pattern; removing the first spacer pattern; and etching the substrate using the second spacer pattern as an etch mask.

17 Claims, 41 Drawing Sheets

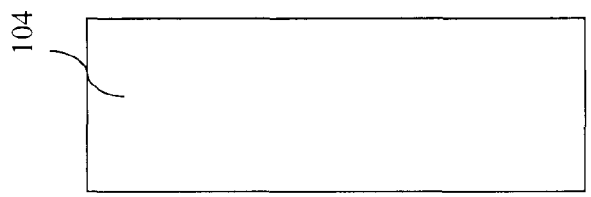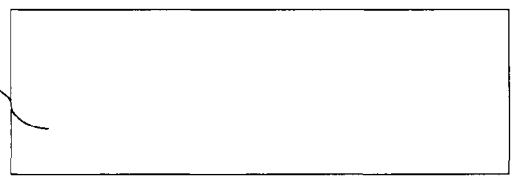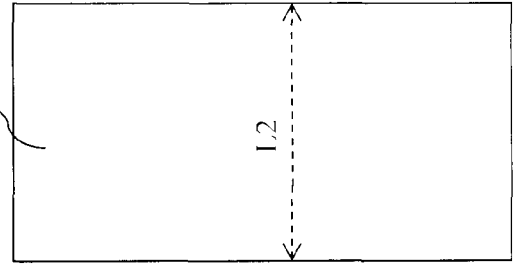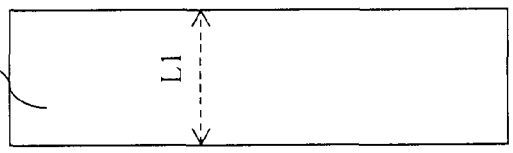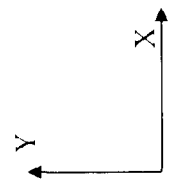
Fig. 37

INTEGRATED CIRCUIT LAYOUT AND METHOD WITH DOUBLE PATTERNING

BACKGROUND

Semiconductor technologies are continually progressing to smaller feature sizes, for example down to feature sizes of 28 nanometers, 20 nanometers, and below. Various integrated circuit (IC) features with small feature sizes are formed on a semiconductor wafer by various techniques. For example, double patterning is used to form a plurality of features with small pitch. However, there is no effective way to fabricate a irregular pattern by double patterning.

Therefore, what is needed is a method and a photomask structure to provide effective IC design and fabrication for the advanced IC technologies addressing the above problems.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 37-38 are top views of a semiconductor structure at various fabrication stages and constructed according to aspects of the present disclosure in one or more embodiments.

DETAILED DESCRIPTION

Figure 1:
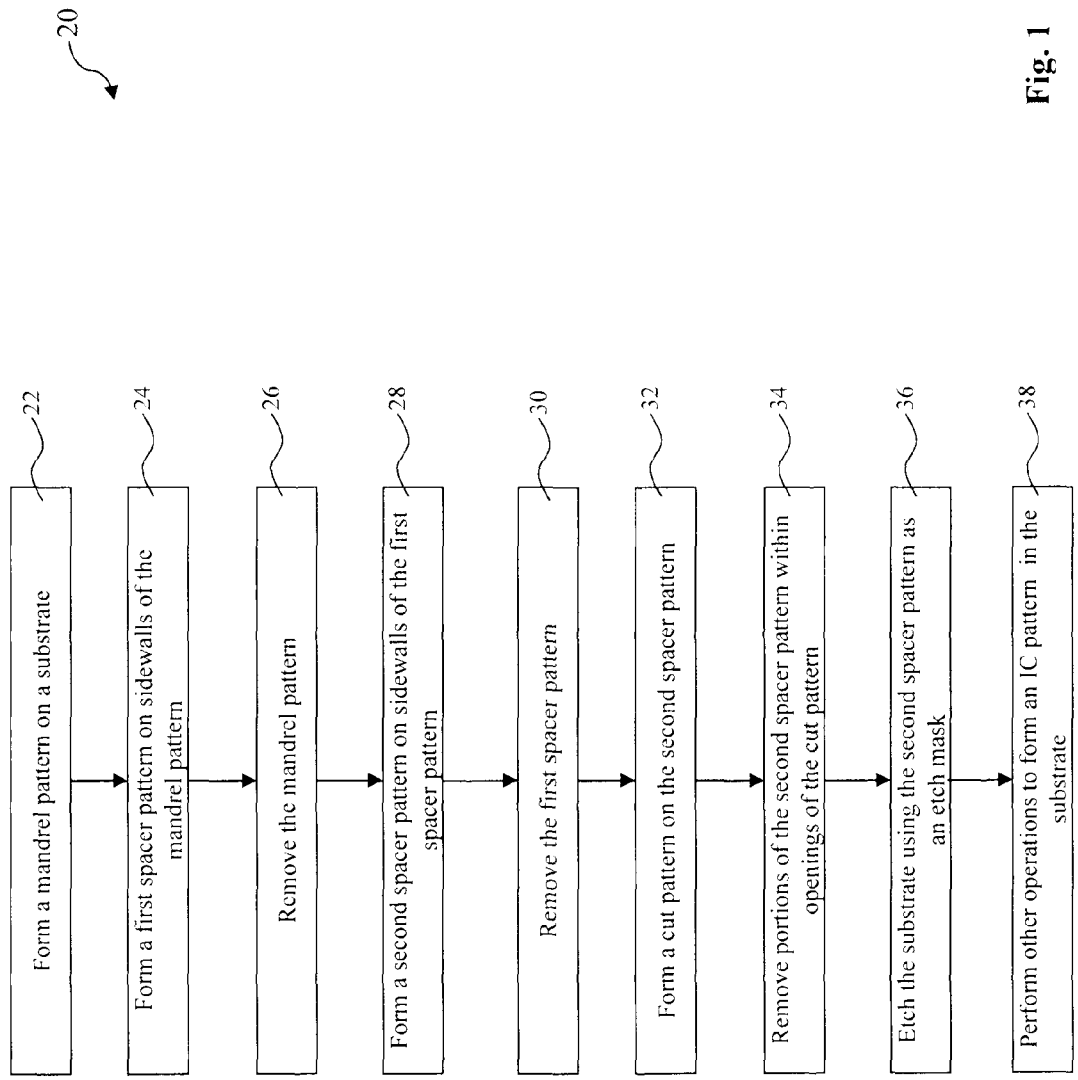
FIG. 1 is a flowchart of an embodiment of an integrated circuit (IC) method constructed according to aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 20 for making integrated circuit (IC) constructed according to various aspects of the present disclosure in one or more embodiments. FIGS. 2-10 are sectional views of a semiconductor structure 100 at various fabrication stages. The semiconductor structure 100 is one example of a semiconductor structure to be fabricated by the method 20. The method 20 and the semiconductor structure 100 are collective described with reference to FIGS. 1-10.

The method 20 begins at an operation 22 by forming a hard mask pattern 104 on a substrate 102. The hard mask pattern 104 is a dummy pattern and will be removed at a later fabrication stage. The hard mask pattern 104 is also referred to as a mandrel pattern 104. The substrate 102 includes a semiconductor substrate, such as a silicon wafer. Alternatively, the substrate 102 includes germanium, silicon germanium or other proper semiconductor materials. The substrate 102 may also include various doped regions such as n-well and p-wells. In one embodiment, the substrate 102 includes an epitaxy (or epi) semiconductor layer. In another embodiment, the substrate 102 includes a buried dielectric material layer for isolation formed by a proper technology, such as a technology referred to as separation by implanted oxygen (SIMOX). In some embodiments, the substrate 102 may be a semiconductor on insulator, such as silicon on insulator (SOI).

In the operation 22, an IC layout (or IC design pattern) is received or provided by a designer. In one example, the designer can be a design house or a design team separated from a semiconductor manufacturer assigned for making IC products according to the IC layout. In various embodiments, the semiconductor manufacturer is capable for making photomasks (masks), semiconductor wafers, or both. The IC layout includes various geometrical patterns designed for an IC product and based on the specification of the IC product. For example, the IC layout includes a pattern defining a fin-like active region structure where a plurality of IC devices, such as fin-like field-effect transistors (FinFETs), is to be formed thereon. In one embodiment, the IC pattern is defined in a photmask (mask).

In the present embodiment, the mandrel pattern 104 defines various openings thereby such that the substrate 102 is exposed within the openings. In one embodiment, the formation of the mandrel pattern 104 includes depositing a mandrel material layer, such as a dielectric material (silicon oxide, silicon nitride for examples); forming a resist pattern; and etching the mandrel material layer using the resist layer as an etch mask, thereby forming the mandrel pattern 104. The resist pattern includes a resist material sensitive to a radiation beam and is formed by a lithography process. In one example, the lithography process includes coating a resist layer on the mandrel material layer, performing a lithography exposure process to the resist layer according to the IC layout and developing the exposed resist layer to form the resist pattern. The lithography exposure process uses the radiation beam, such as light (such as ultraviolet-UV, deep ultraviolet-DUV or extreme ultraviolet-EUV), to chemically change the exposed portion of the resist layer. In the present embodiment, the lithography exposure process utilizes a mask with the IC layout defined thereon. The mask may be a binary mask, a phase shift mask (PSM) or a reflective mask, such as a reflective mask used for EUV lithography exposure process.

Figure 2:
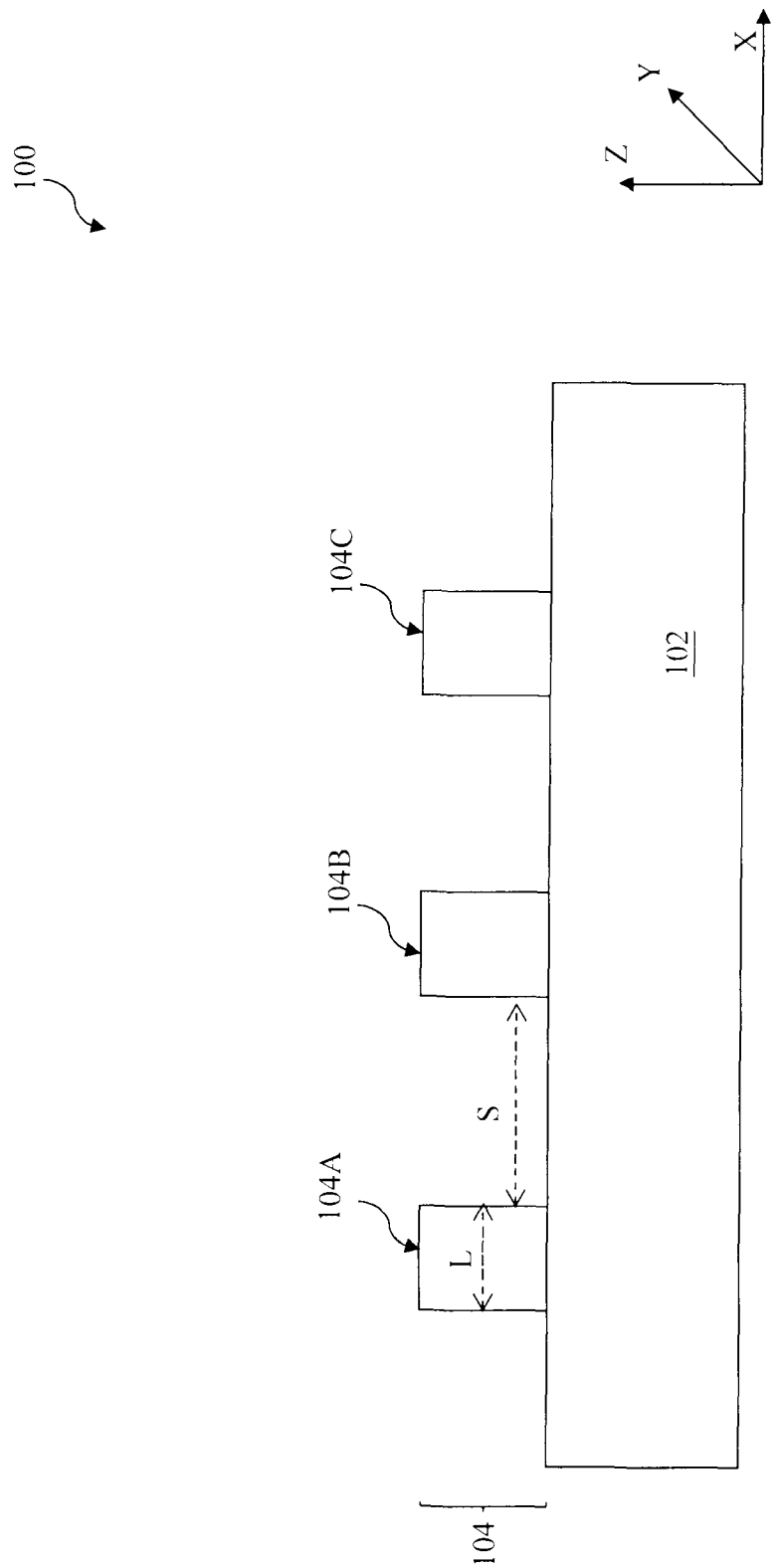
FIGS. 2-10 are sectional views of a semiconductor structure at various fabrication stages and constructed according to aspects of the present disclosure in one or more embodiments.

The mandrel pattern 104 includes a plurality of first features oriented in the Y direction and spaced away in the X direction perpendicular to the Y direction. Examples of the first features are also referred to as 104, or particularly as 104A, 104B and 104C, respectively. The first features 104 are characterized with a first width L and a first spacing S, as illustrated in FIG. 2. Especially, the first width L may be a constant or alternatively be a variable that changes from feature to feature. Similarly, the first spacing S may be a constant or alternatively be a variable that changes over different features.

Figure 3:
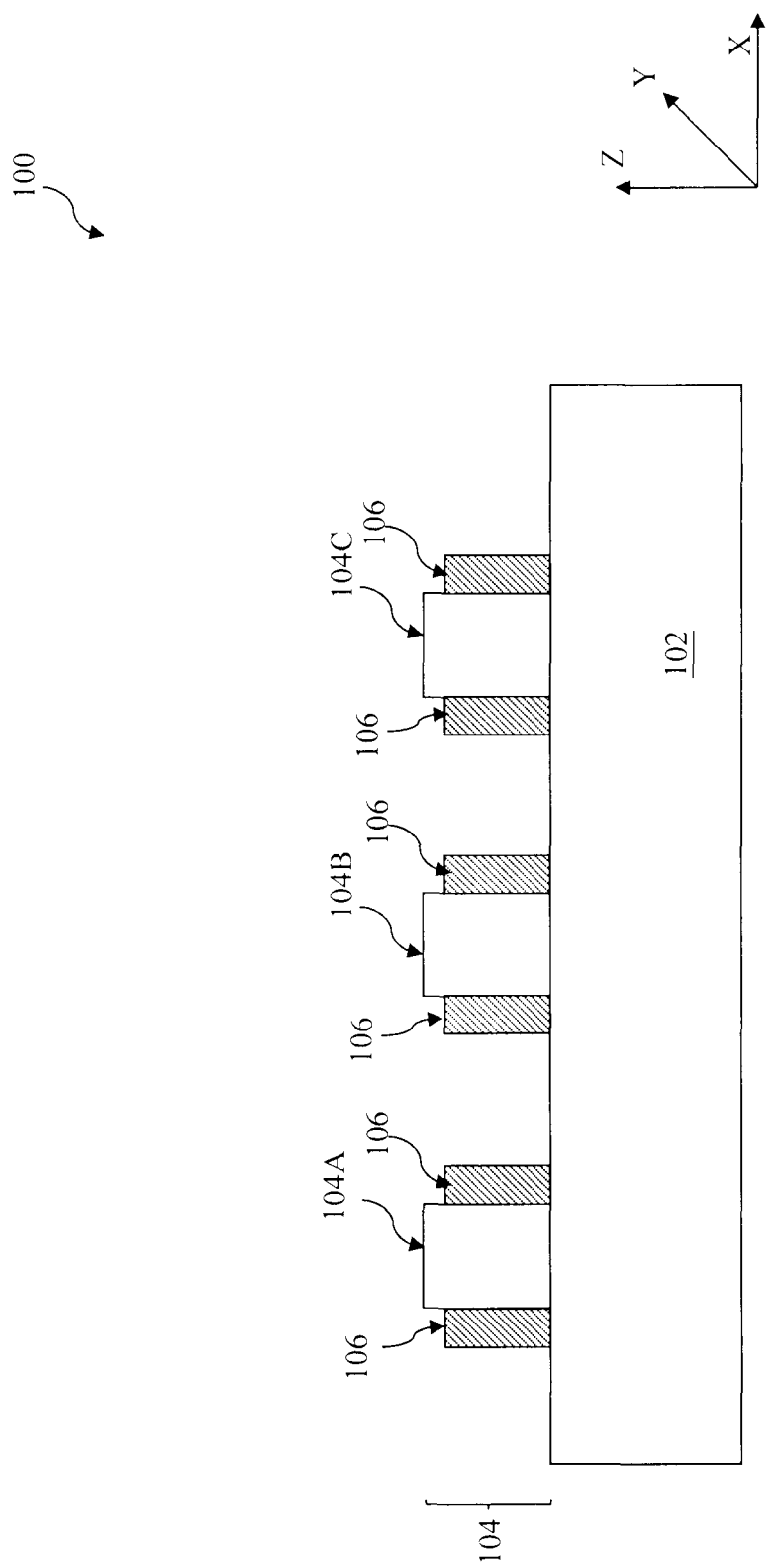

The method 20 proceeds to an operation 24 by forming a first spacer pattern 106 on sidewalls of the mandrel pattern 104, as illustrated in FIG. 3. In one embodiment, the formation of the first spacer pattern 106 includes depositing a first spacer material layer on the substrate 102 and the mandrel pattern 104, and thereafter performing a first anisotropic etch to the first spacer material layer, thereby forming the first spacer pattern 106. The first spacer material layer may include a dielectric material (such as silicon oxide, silicon nitride or silicon carbide) but is different from the mandrel material layer to achieve etching selectivity during the first anisotropic etch. The deposition of the first spacer material layer includes a suitable technique, such as chemical vapor deposition (CVD). The thickness of the first spacer material layer is referred to as a first processing parameter "b". The first anisotropic etch may include a plasma etch in one example. The first spacer pattern 106 includes a plurality of second features oriented in the Y direction and spaced from each other in the X direction.

Figure 4:
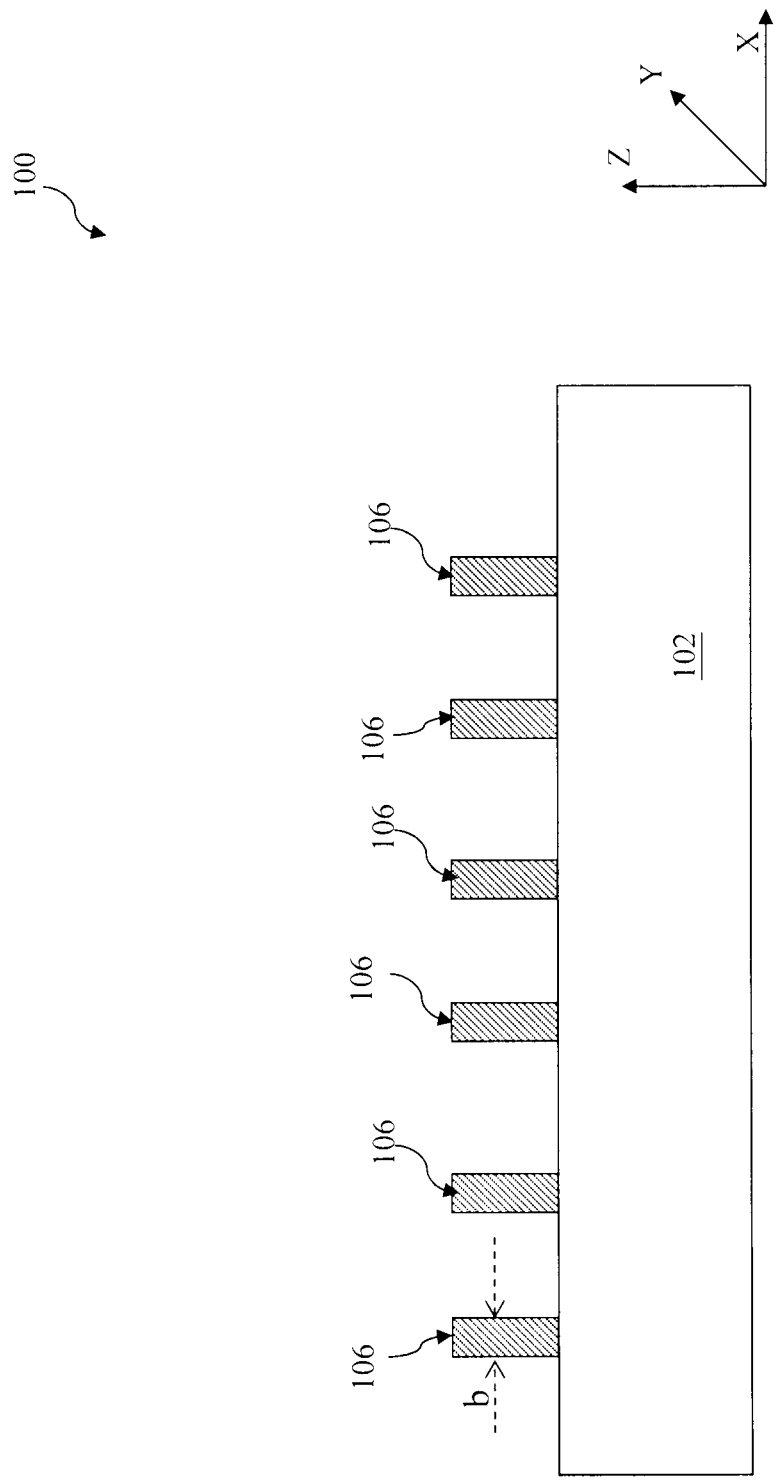

The method 20 proceeds to an operation 26 by removing the mandrel pattern 104, as illustrated in FIG. 4. The mandrel pattern 104 is removed by an etch process that selectively removes the mandrel material layer but substantially does not etch the first spacer material layer. The first features in the first spacer pattern 106 have a second width that is substantially equal to the deposited thickness "b" of the first spacer material layer, as shown in FIG. 4.

Figure 5:
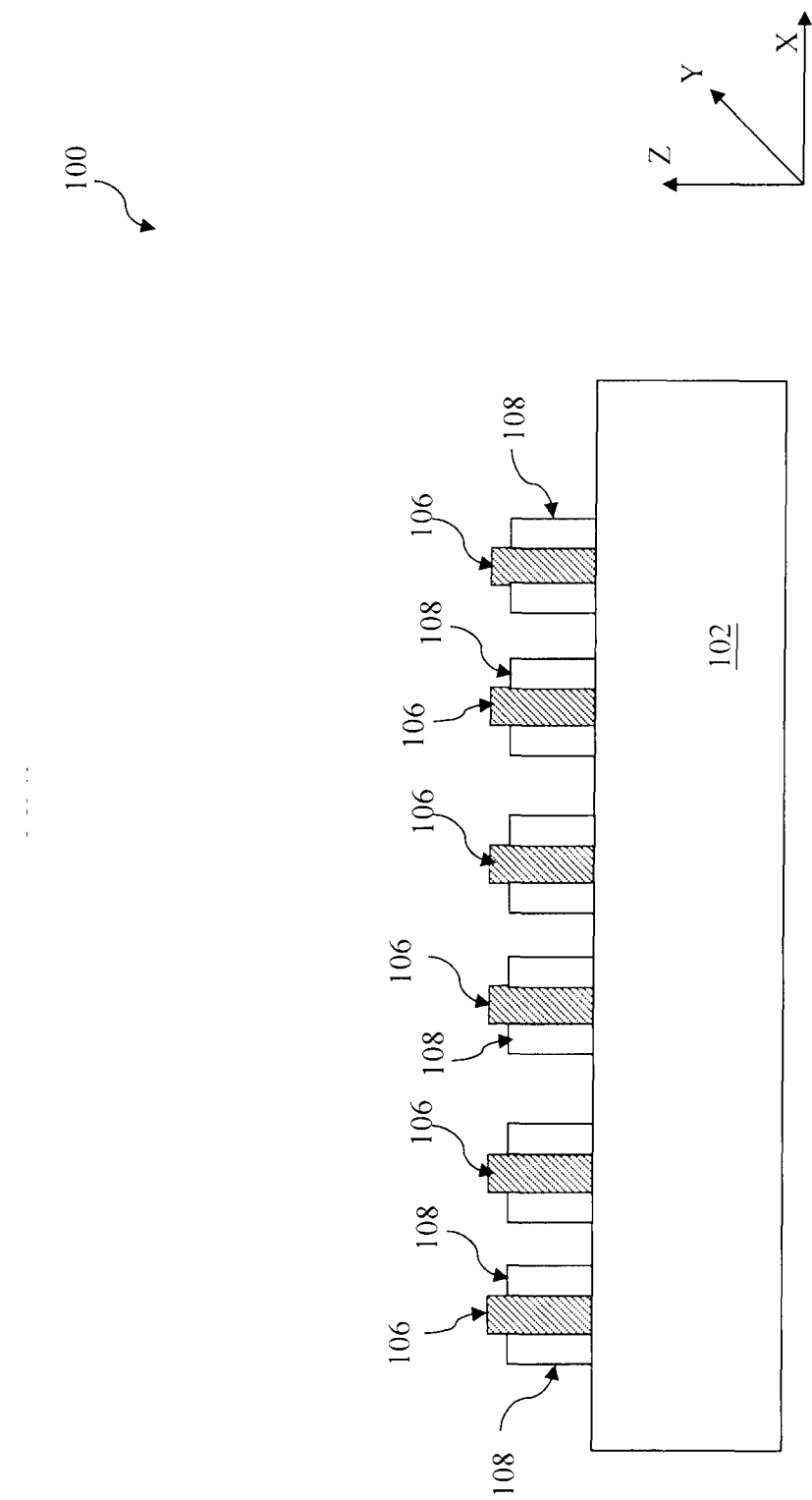

The method 20 proceeds to an operation 28 by forming a second spacer pattern 108 on sidewalls of the first spacer pattern 106, as illustrated in FIG. 5. In one embodiment, the formation of the second spacer pattern 108 includes depositing a second spacer material layer on the substrate 102 and the first spacer pattern 106, and thereafter performing a second anisotropic etch to the second spacer material layer, thereby forming the second spacer pattern 108. The second spacer material layer may include a dielectric material (such as silicon oxide, silicon nitride or silicon carbide) but is different from the first spacer mandrel material layer to achieve etching selectivity during the second anisotropic etch. The deposition of the second spacer material layer includes a suitable technique, such as CVD. The thickness of the second spacer material layer is referred to as a second processing parameter "c". The second anisotropic etch may include a plasma etch in one example. The second spacer pattern 108 includes a plurality of third features oriented in the Y direction and spaced from each other in the X direction.

Figure 6:
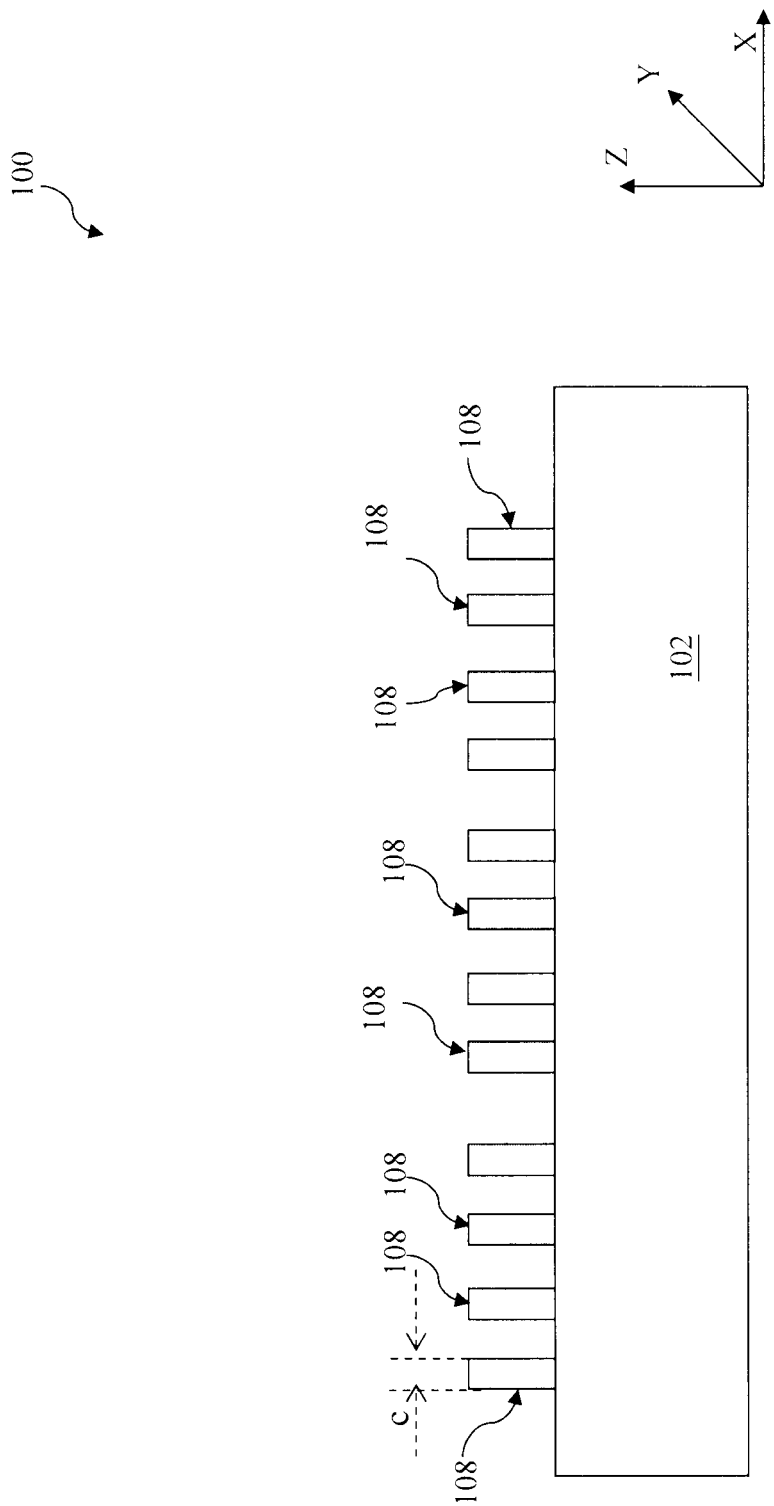

The method 20 proceeds to an operation 30 by removing the first spacer pattern 106, as illustrated in FIG. 6. The first spacer pattern 106 is removed by an etch process that selectively removes the first spacer material layer but substantially does not etch the second spacer material layer. The third features in the second spacer pattern 108 have a third width that is substantially equal to the deposited thickness "c" of the second spacer material layer, as shown in FIG. 6.

Figure 7:
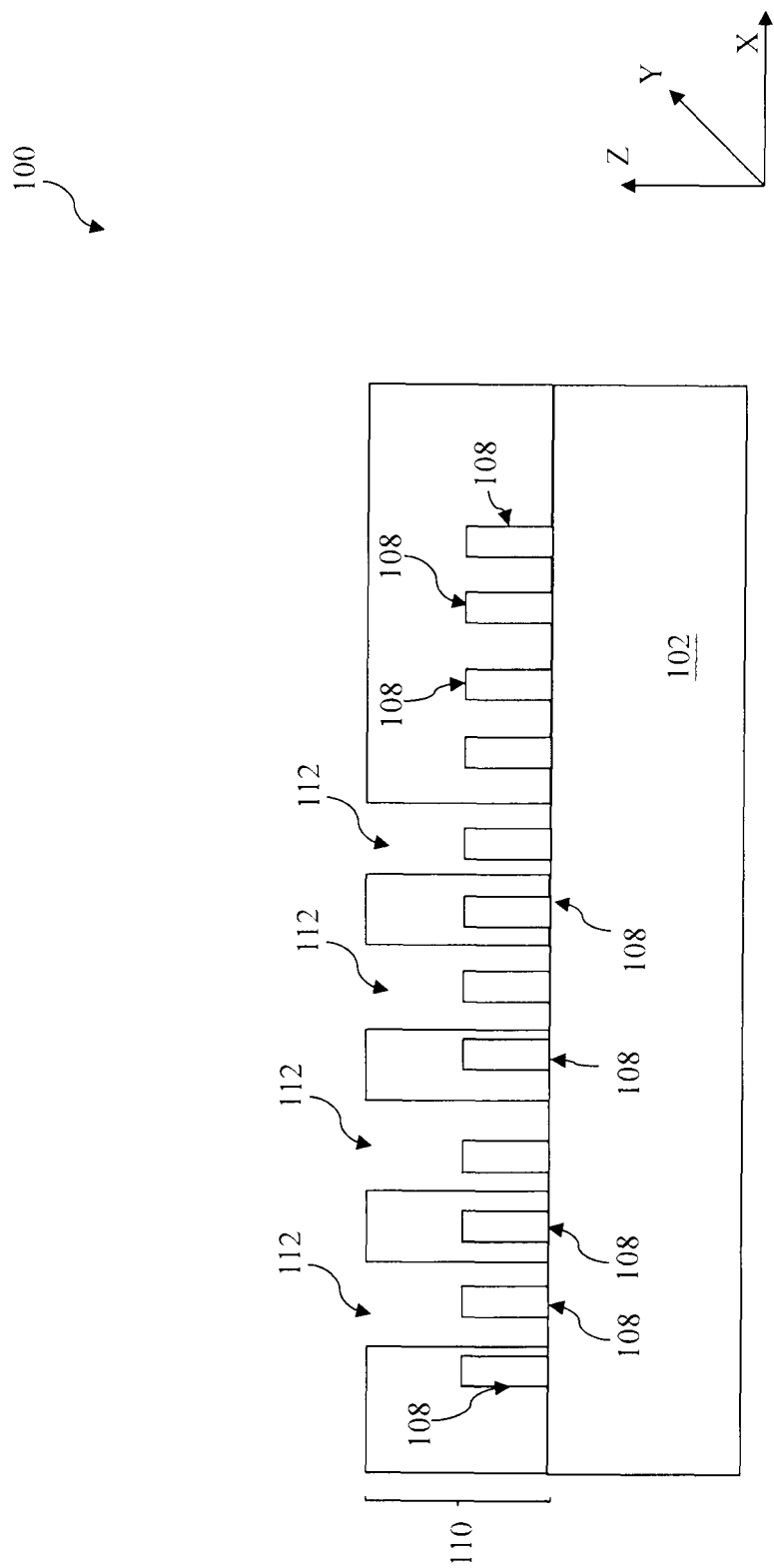
Figure 41:
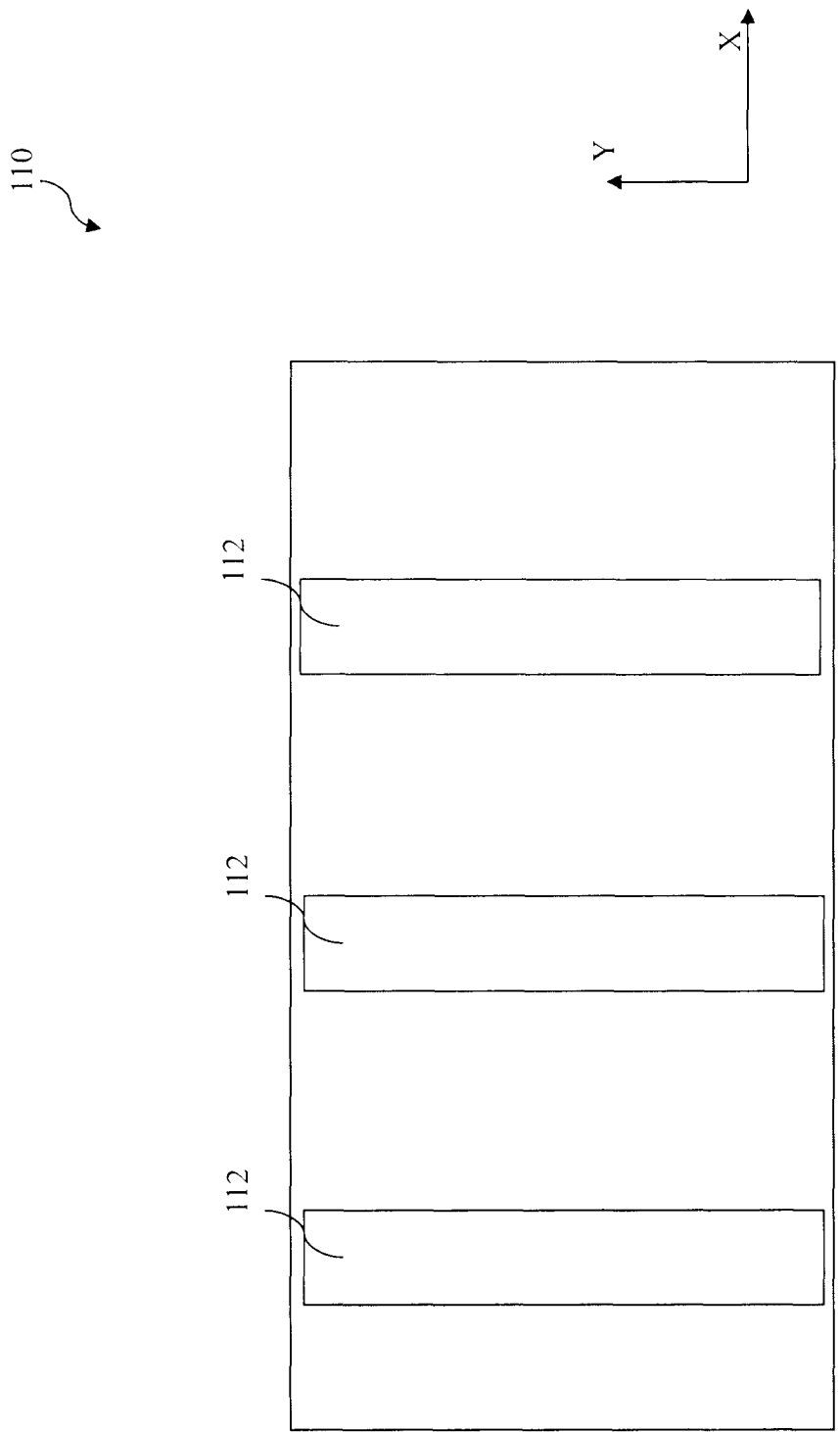
FIG. 41 is a top view of a cut pattern constructed according to aspects of the present disclosure in one or more embodiments.

The method 20 proceeds to an operation 32 by forming a cut pattern 110 having openings 112 such that a subset of the third features within the openings 112 are uncovered, as illustrated in FIG. 7. The cut pattern 110 is used as an etch mask during a subsequent etch process to remove the subset of the third features in the second spacer pattern 108. The cut pattern 110 may include a resist layer patterned by a second lithography process. The second lithography process may utilize a suitable lithography technique, such as immersion lithography. Alternatively, the cut pattern 110 includes a hard mask material (dielectric material such as silicon oxide or silicon nitride) different from the second spacer material layer to achieve etch selectivity and is patterned by a procedure that includes depositing a dielectric material layer, forming a resist pattern on the dielectric material layer, and etching the dielectric material layer using the resist pattern as an etch mask. The cut pattern 110 and various openings 112 defined thereon are further shown in FIG. 41 in a top view.

Figure 8:
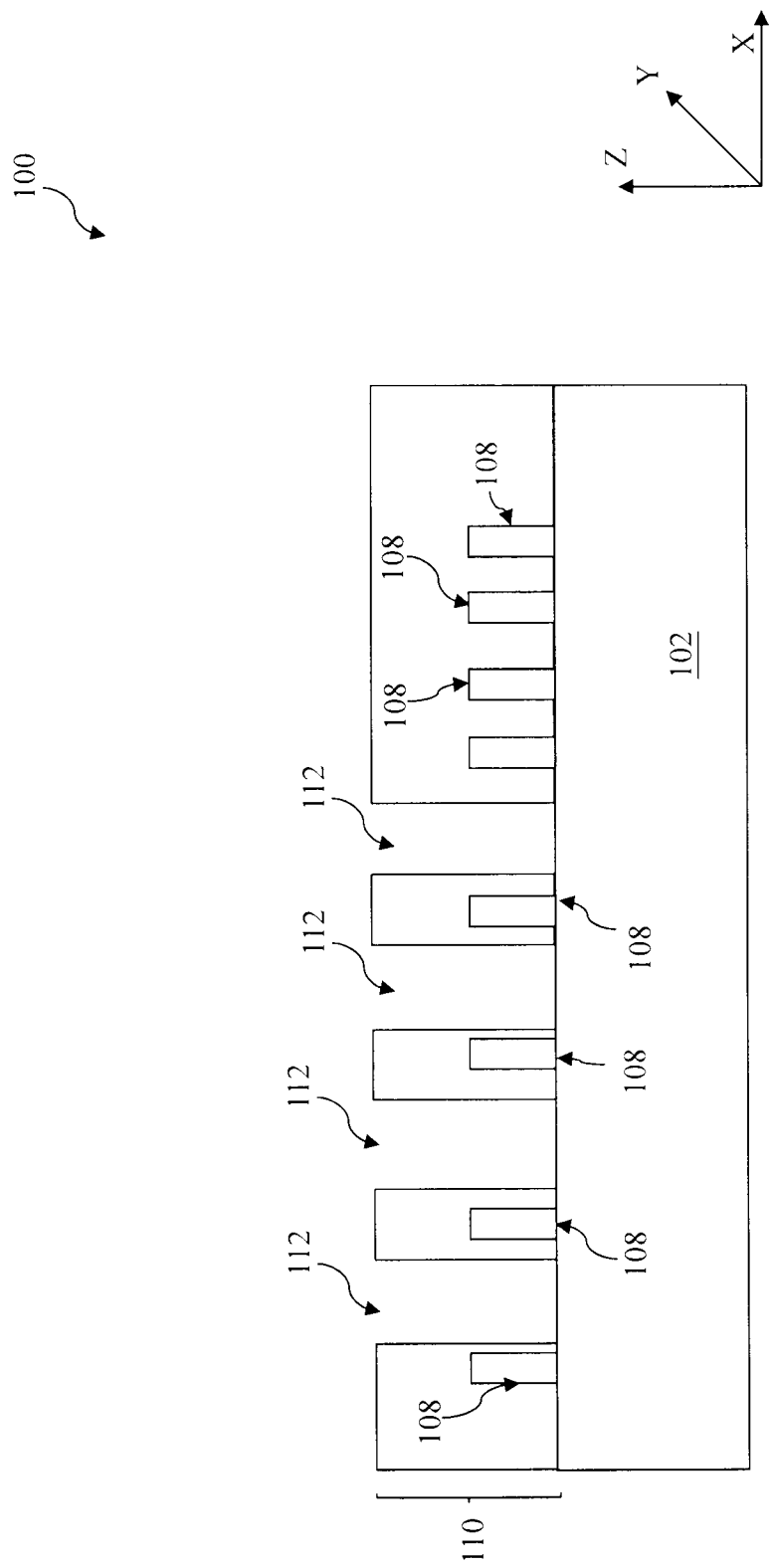
Figure 9:
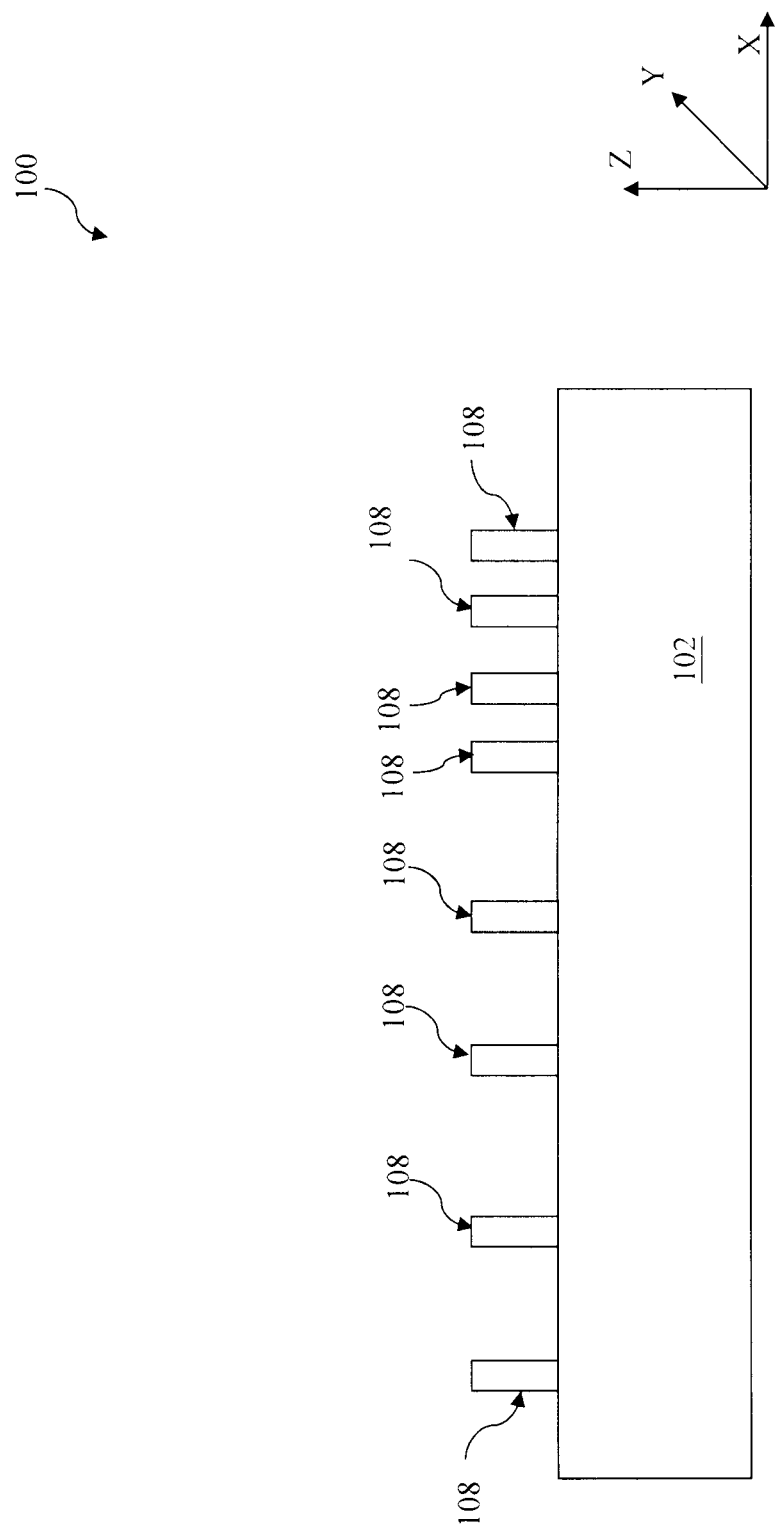

The method 20 may proceed to an operation 34 by removing the subset of the third features in the second spacer pattern 108, as illustrated in FIG. 8. The subset of the third features in the second spacer pattern 108 is removed by an etch process that selectively removes the second spacer material layer but substantially does not etch the cut pattern 110. Thereafter, the cut pattern 110 is removed by a suitable process, as illustrated in FIG. 9. In one example where the cut pattern 110 is a resist pattern, the cut pattern 110 is removed by wet stripping or plasma ashing. In another example wherein the cut pattern 110 is a hard mask pattern of a dielectric material, the cut pattern 110 may be removed by a wet etching process to selectively remove the hard mask material. The second spacer pattern is still labeled by 108 but is reduced since the subset of the third features is removed.

Figure 10:
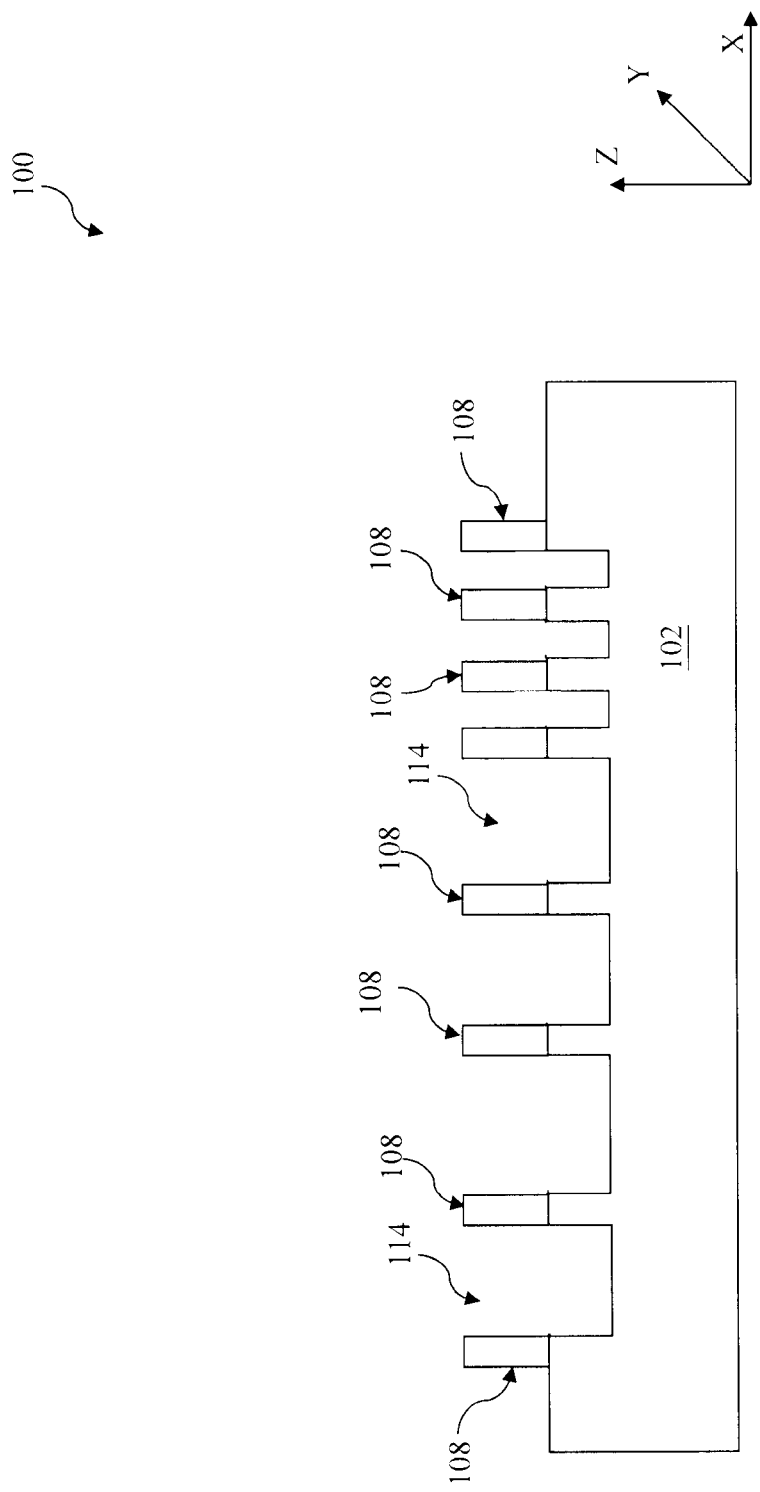

Referring to FIG. 10, the method 20 proceeds to an operation 36 by etching the substrate 102 to form a plurality of trenches 114 in the substrate 102 using the second spacer pattern 108 as an etch mask. The etching process applied to the substrate 102 is designed to selectively etch the substrate 102, such as selectively etching silicon. The etching process may include dry etch and/or wet etch and may include multiple etch steps to optimize the etch effect. For example, the etch process includes a dry etch to substantially remove most portion and a wet etch to further remove the rest portion. In one embodiment, one or more hard mask layers are disposed on the substrate 102. In this case, the second spacer pattern 108 is used to pattern the hard mask layers. Thereafter, the substrate 102 is patterned to form the trenches 114 through the patterned hard mask layers.

Alternatively, the second spacer pattern 108 is used as an ion implantation mask. An ion implantation process is applied to the substrate to form various doped features in the substrate 102 through the openings of the second spacer pattern 108. The third features in the second spacer pattern 108 prevent the ion implantation to introduce dopant to the substrate in the regions protected by the third features.

Thereafter, the second spacer pattern 108 is removed by a suitable etch process, such as wet etch. The method 20 may include other operations before, during or after the operations 22-36. For example, the method 20 includes an operation 38 by forming an IC pattern in the substrate 102. In the present embodiment, the second spacer pattern 108 defines fin-like active regions for FinFETs. In this case, the operation 38 forms fin-like active regions in the substrate 102.

In one embodiment, the operation 38 includes forming shallow trench isolation (STI) features and recessing the STI features to form the tin-like active regions. The formation of the STI features may implement a procedure that includes depositing one or more dielectric material to fill the trenches; and performing a polishing process, such as chemical mechanical polishing (CMP), to remove excessive dielectric material on the substrate and planarize the top surface. The recessing of the STI features may include an etch process to selectively etch the STI features such that the STI features are recessed below the top surface of the substrate 102.

In another embodiment, the operation 38 includes forming STI features and selectively epitaxy growing a semiconductor material on the substrate 102, thereby forming the fin-like active regions. The semiconductor material selectively epitaxy grown on the substrate 102 may be same to the semiconductor material of the substrate or alternatively different. For example, the substrate 102 includes silicon, and the semiconductor material selectively epitaxy grown thereon includes germanium (Ge), silicon germanium (SiGe) or other semiconductor material different from silicon in composition, such a III-V group semiconductor material. In another example, the substrate 102 includes germanium or silicon germanium, and the semiconductor material selectively epitaxy grown thereon includes silicon or other semiconductor material different in composition.

The disclosed method 20 forms the second spacer pattern 108 (illustrated in FIG. 6 or FIG. 9) with various configurations. Especially, the second spacer pattern 108 may include an irregular pattern. For example, the second spacer pattern has a non-periodic structure. Particularly, in the irregular pattern, the third features in the second spacer pattern 108 have a variable pitch that changes over the third features. In the method 200, two groups of parameters are introduced and defined: a first group includes L and S referred to as mask parameters and a second group includes b and c referred to as processing parameters. The mask parameters are associated with masks used in the lithography processes of the method 20. The mask parameters may further include other parameters associated with the cut pattern 110. The processing parameters are related to various processing operations, such as depositions to form first and second spacer material layers, respectively. The method 20 further includes a procedure to choose various combinations of the mask parameters and the processing parameters in order to form different IC patterns, especially irregular IC pattern. This is further described below according to various embodiments.

Figure 11:
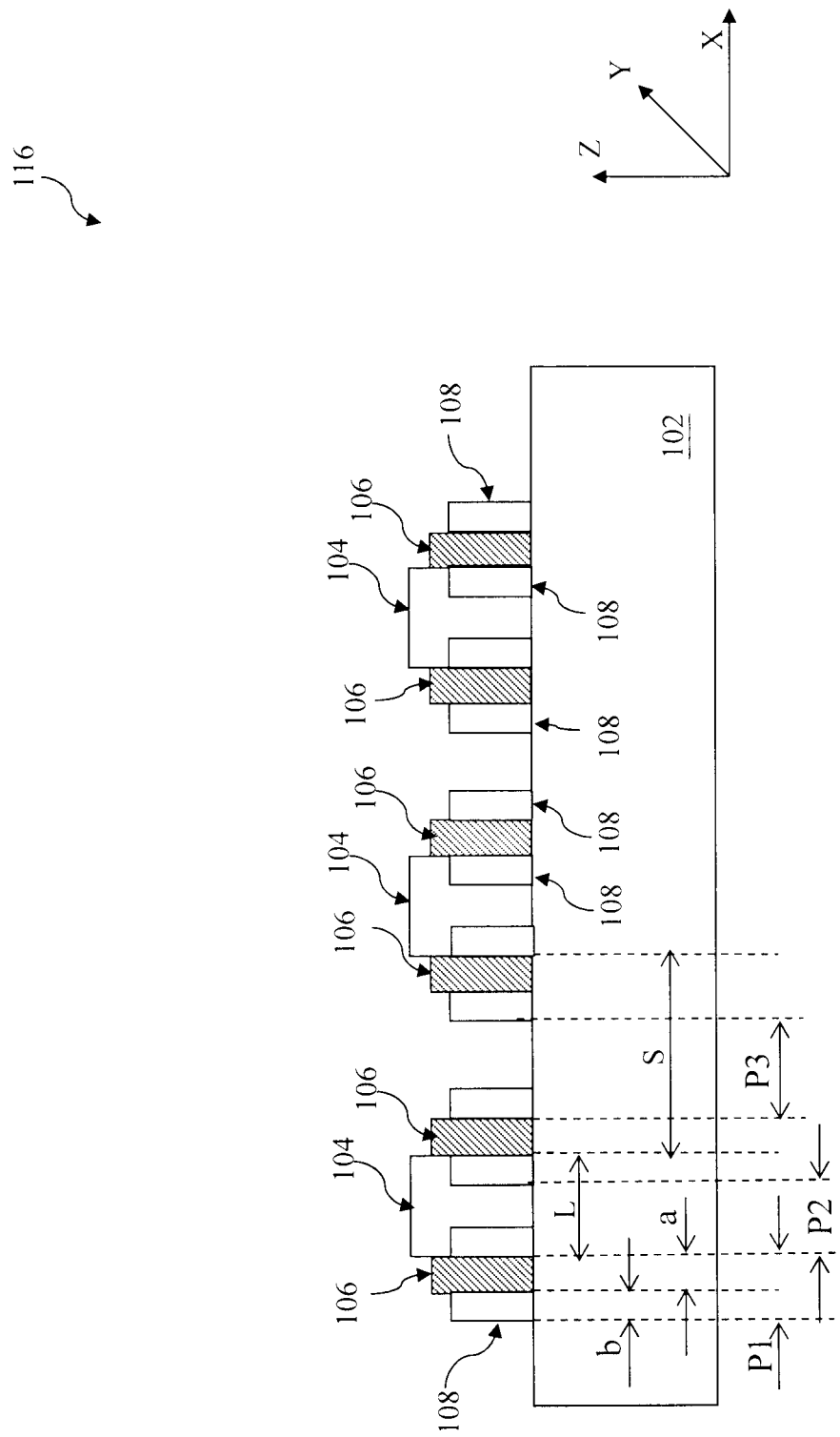
FIG. 11 is a sectional view of a semiconductor structure constructed according to aspects of the present disclosure in one or more embodiments.
Figure 12:
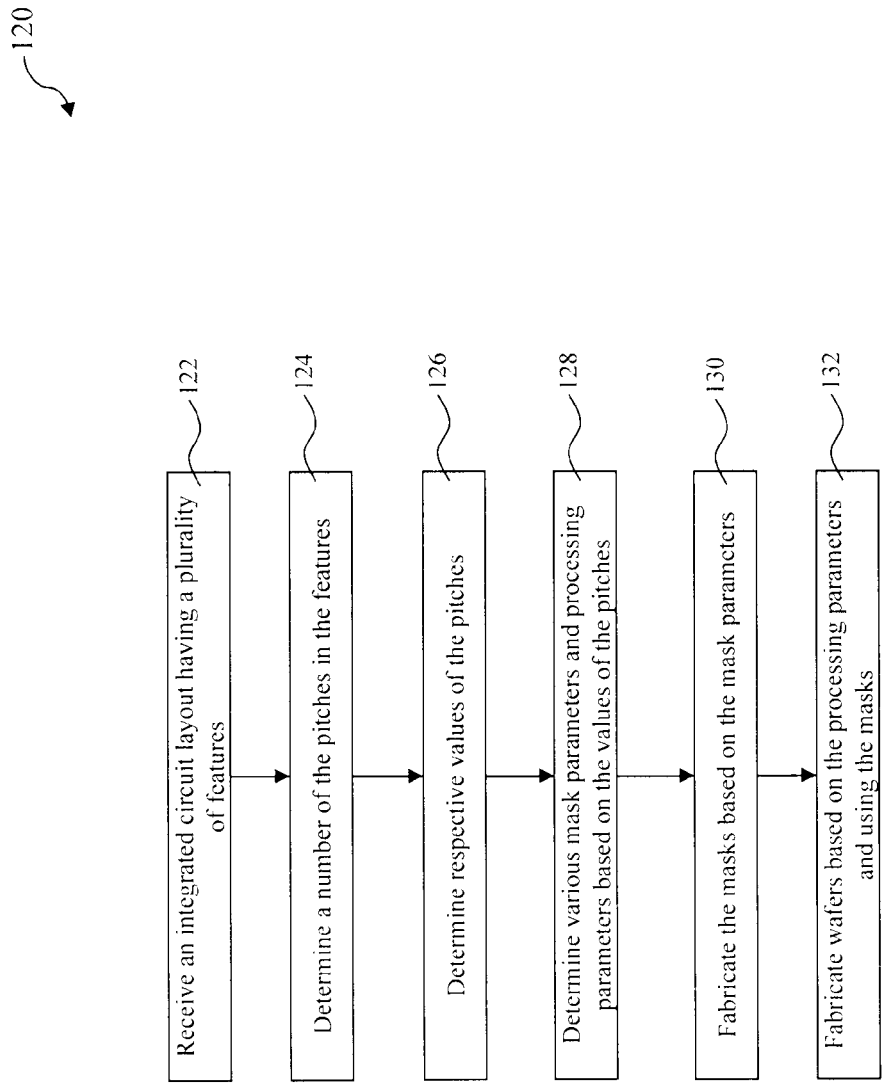
FIG. 12 is a flowchart of an embodiment of an IC method constructed according to aspects of the present disclosure.
Figure 13:
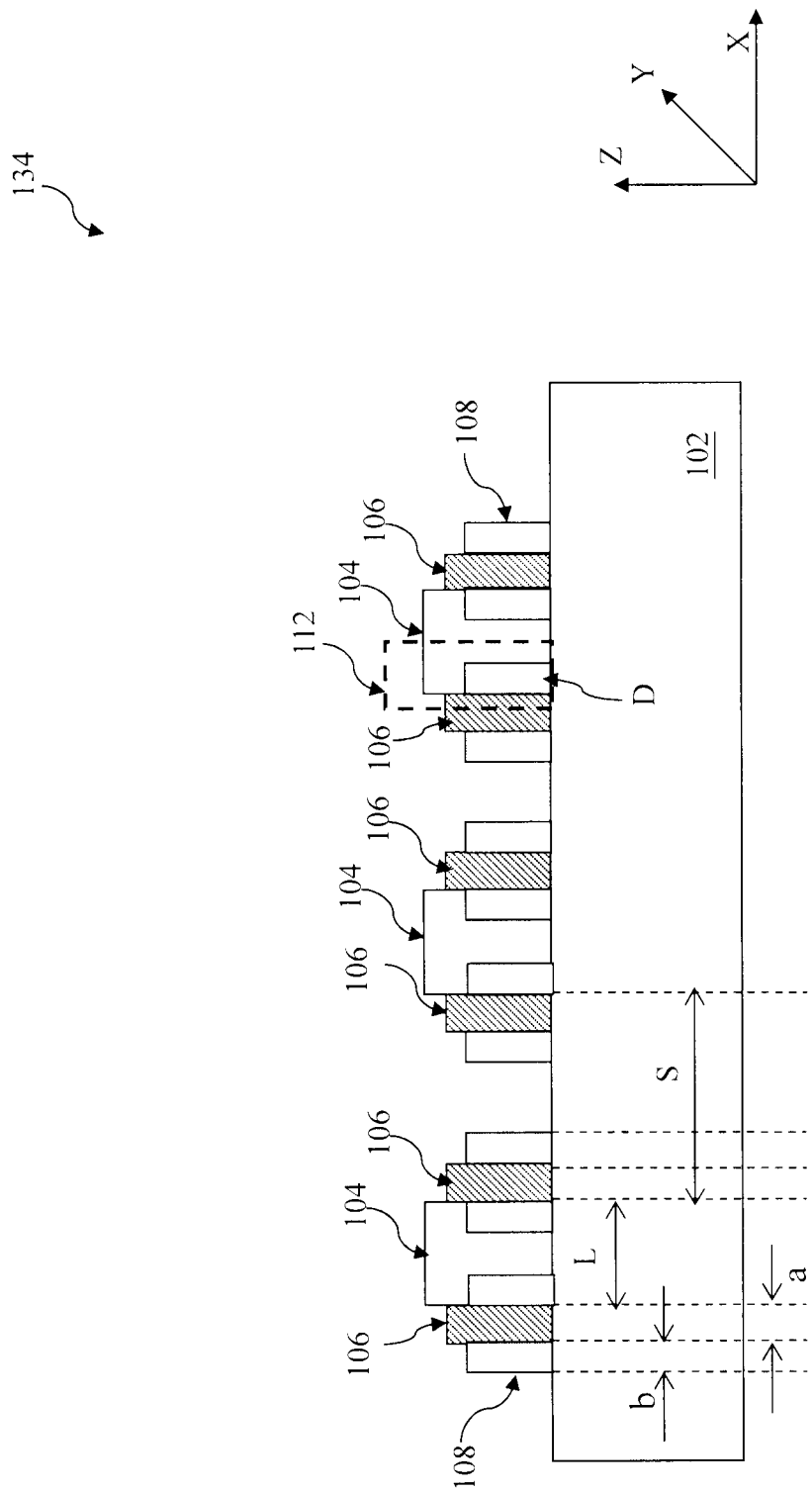
FIG. 13 is a sectional view of a semiconductor structure constructed according to aspects of the present disclosure in one or more other embodiments.

FIG. 11 illustrates a sectional view of the semiconductor structure 100 but with various features present only for better understanding even though in reality those features are not present at a same fabrication stage, therefore, the structure in FIG. 11 is referred to as the semiconductor structure 116. It is understood that the structure 116 is only for illustration. FIG. 13 illustrates a sectional view of the semiconductor structure 134 according to another embodiment. The structure 134 is similar to the structure 116 wherein various features are present only for better understanding even though in reality those features are not present at a same fabrication stages. The structure 134 further includes a cut pattern with one or more cut openings 112. Various parameters are labeled in FIGS. 11 and 13 for following description. FIG. 12 is a flowchart of a method 120 for making an IC pattern constructed according to aspects of the present disclosure in various embodiments. The method 120 is used to determine various parameters and is combined with the method 20 to form an IC pattern with various structures, especially various irregular structures. For example, the method 120 is implemented to determine the mask and processing parameters; and the method 20 is implemented to form an IC pattern according to the parameters determined by the method 120. The method 120 is described with reference to FIGS. 11-13 and further reference to other figures.

The method 120 begins at operation 122 by receiving an IC layout having a plurality of third features, such as the second spacer pattern 108 in FIG. 9 that may define various fin-like active regions in the substrate 102.

The method 120 may proceed to an operation 124 by determining a number of the pitches in the third features (also referred to as 108). The third features are oriented in the Y direction and spacer away from each other in the X direction. In one embodiment, the third features 108 are configured in the X direction in a periodic structure which has one pitch P1. The pitch is defined as a dimension from an edge of one feature in the second spacer pattern to the same edge of an adjacent feature in the second spacer pattern. In another embodiment, the third features 108 are configured in the X direction in a non-periodic structure (irregular structure) which has two pitches P1 and P2 or alternatively has multiple pitches, such as P1. P2 and P3. In the irregular structure, a first subset of the third features has one pitch (such as P1) and a second subset of the third features has another pitch (such as P2), and so on.

The method 120 proceeds to an operation 126 by determining respective values of the pitches in the third features 108. Those values may be directly extracted from the IC layout. For example, P1 is 82 nm and P2 is 94 nm.

The method 120 proceeds to an operation 128 by determining various mask parameters and processing parameters based on the IC layout, specifically based on the respective values of the pitches. The mask parameters include L and S that are defined in the mask to form the mandrel pattern 104 in the first lithography process of the method 20. The processing parameters include b and c that are used in the method 20 to deposit the first and second spacer material layers, respectively. Those parameters are marked in FIG. 11. The method to determine those parameters are further described later according to various examples. In one example, the first pitch P1=b+c, the second pitch P2=L−c, and the third pitch P3=S−2b−c, as illustrated in FIG. 11. However, in the situation where the third features of the second spacer pattern 108 within the gap between two adjacent first features of the mandrel pattern 104 are removed by etching through the openings 112 of the cut pattern 110, the third pitch P3=S+c. Based on those equations, the parameters L, S, b and c can be determined based on the pitches P1, P2 and P3.

In one situation, there may be more freedom during the determining the parameters. In this case, the parameter may be further tuned according to other considerations, such as mask check rules and fabrication capability.

In other situation, there may be not enough freedom to choose proper parameters. For example where there are four or more pitches, a cut pattern 110 is properly designed to achieve the irregular pattern during the second lithography process in the method 20 to form the cut pattern 110. The cut pattern includes one or more openings 112 that define various third features to be removed, such as illustrated in FIG. 13. The cut pattern may be designed to have different width, spacing, one or more pitch for the purpose. Additionally or alternatively, the processing parameters b and/or c may be designed to cause merging to achieve the irregular pattern with multiple pitches. The cut pattern may be designed to remove the merged features.

In another example where the number of pitches is 2, the irregular pattern can be formed by requiring P1=P2, P2=P3 or P1=P3. In yet another example where the number of pitches is 1, the irregular pattern can be formed by requiring P1=P2=P3.

In another example, by adjusting L and S such that S<=2b and |L−S|=2c, the second features in the first spacer pattern 106 are merged and a periodic (regular) pattern is achieved with a pitch P1=(L+S)/2. In a particular example, b=24, c=12, S=48 and L=72, therefore P1=60. Those values can be any proper unit, such as nanometer (nm).

In another example, by adjusting L and S such that S<=2b+2c and assigning "D" as a dummy feature (as illustrated in FIG. 13) to be removed during the operations 32 and 34 of the method 20, an non-periodic (irregular) pattern is achieved with one pitch as L−c and another pitch as S+c. In a particular example, c=12, S=72 and L=80, therefore one pitch is 58 and another pitch is 84. The parameter b has a freedom to be adjustable for other consideration, such as optimizing the processing window.

The method 120 proceeds to an operation 130 by making mask(s) according to the IC pattern and determined mask parameters. The operation 130 may include generating the mandrel pattern according to the determined mask parameters and making the mask defining the mandrel pattern. The operation 130 may further include generating the cut pattern according to the determined mask parameters and making the mask defining the cut pattern. A mask may be a binary mask, a phase shift mask, a reflective mask or other suitable mask.

The method 120 proceeds to an operation 132 by fabricating wafers based on the determined processing parameters and using the masks during the respective lithography processes. In the present embodiment, the operation 132 includes the method 20. For example, the operation 132 includes forming the mandrel pattern 104 by the first lithography process using the mask designed according to the mask parameters L and S; forming the first spacer pattern 106 by a procedure that includes depositing the first spacer material layer with a first thickness according to the determined processing parameter b; and forming the second spacer pattern 108 by a procedure that includes depositing the second spacer material layer with a second thickness according to the determined processing parameter c.

The operation 132 may further include forming the cut pattern 110 by the second lithography process using the mask designed according to the mask parameters associated with the cut pattern such as respective width and spacer of the cut features in the cut pattern.

Other embodiments of the methods 20 and 120 are described below according to various embodiments. FIGS. 14-17 are top views of a semiconductor structure 136 at various fabrication stages constructed according to one embodiment. Various mask parameters and processing parameters are determined according to the received IC layout by the method 120 and the fabrication of the semiconductor structure 136 is achieved by the method 20.

Figure 14:
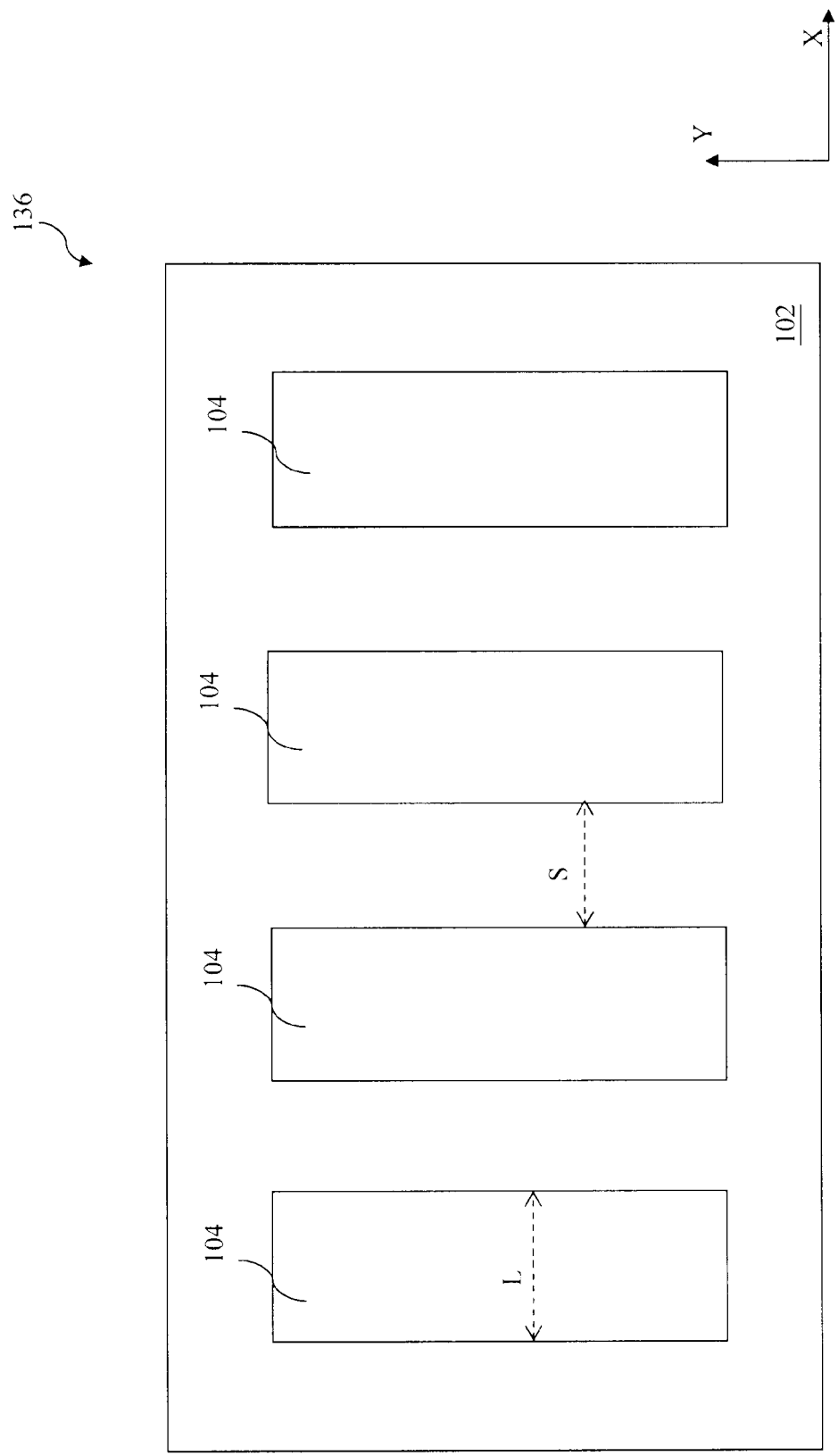
FIGS. 14-17 are top views of a semiconductor structure at various fabrication stages and constructed according to aspects of the present disclosure in one or more embodiments.

Referring to FIG. 14, a mandrel pattern 104 is formed on the substrate 102. The substrate 102 is not illustrated in the following figures for simplicity. The mandrel pattern 104 includes a plurality of first features in a periodic configuration with the first width L and the first spacing S. In the present embodiment, the ratio L/S is equal to 3/2 or 1.5. In one example for illustration, the width L is about 72 nm and the spacing S is about 48 nm. The mandrel pattern 104 is formed by a procedure, such as the operation 22 of the method 20.

Figure 15:
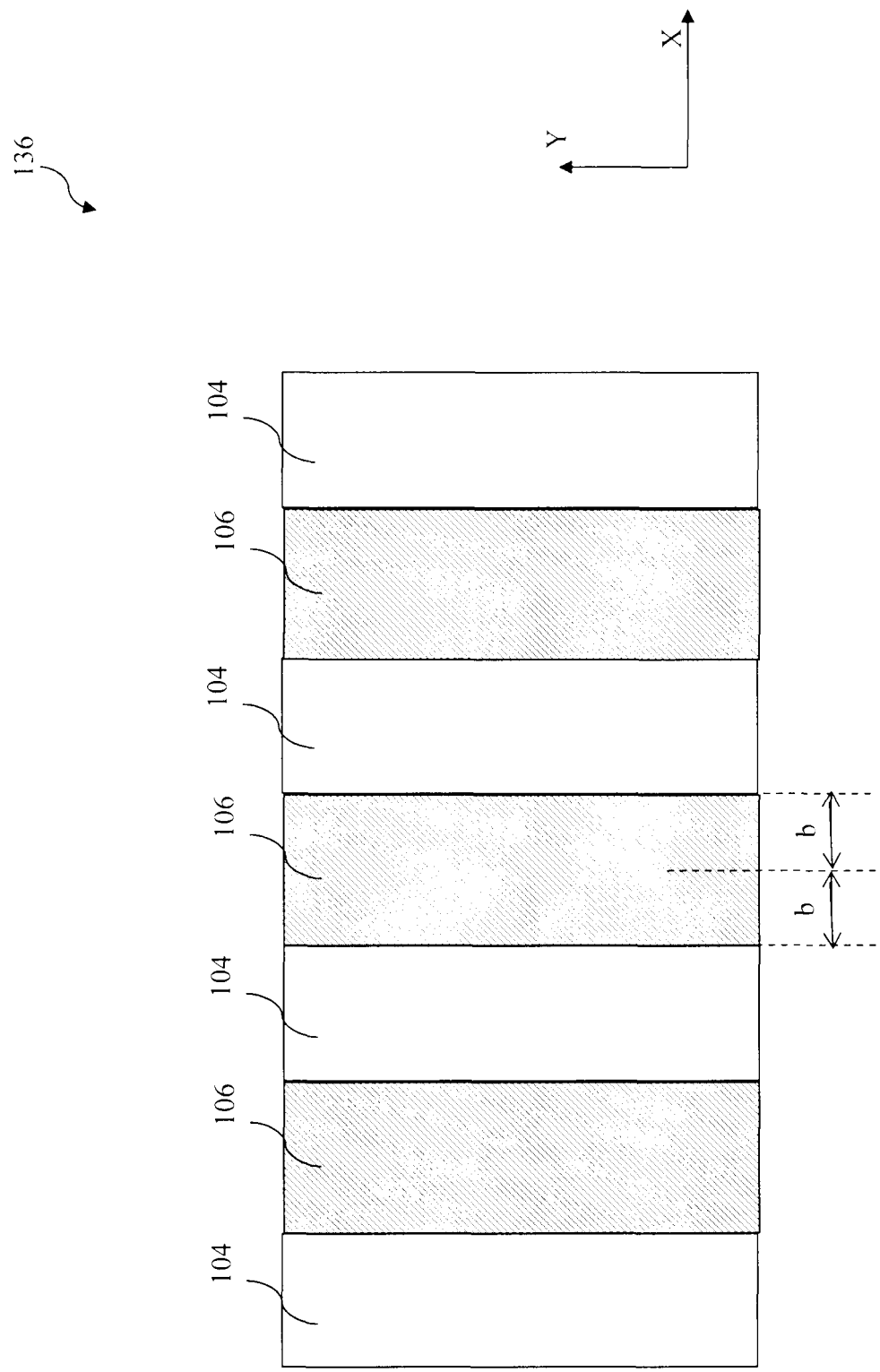

Referring to FIG. 15, the first spacer pattern 106 is formed on the sidewalls of the mandrel pattern 104 by a suitable procedure, such as the operation 24 of the method 20. Especially, the second features of the first spacer pattern 106 are merged together within the gaps of the first features in the mandrel pattern 104. In this case, the deposited thickness b of the first spacer material layer is equal to half of the first spacing S, formulated as b=S/2. In the above example, the deposited thickness b is about 24 nm.

Figure 16:
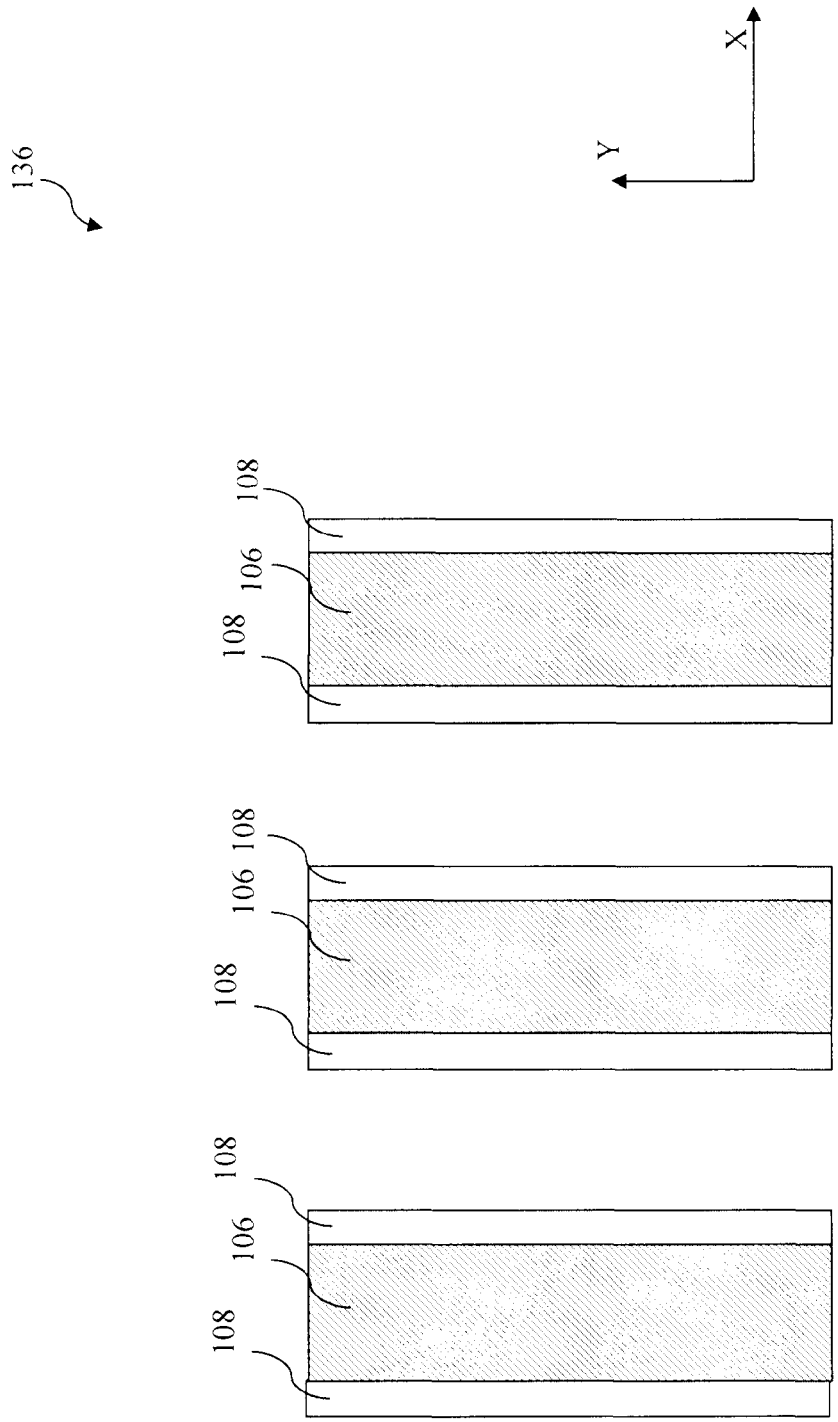

Referring to FIG. 16, the mandrel pattern 104 is removed by a procedure, such as the operation 26 of the method 20 and the second spacer pattern 108 is formed on the sidewalls of the first spacer pattern 106 by a suitable procedure, such as the operation 28 of the method 20. Especially, the deposited thickness c of the second spacer material layer is equal to half of the first thickness b, formulated as c=b/2. In the above example, the deposited thickness c is about 12 nm.

Figure 17:
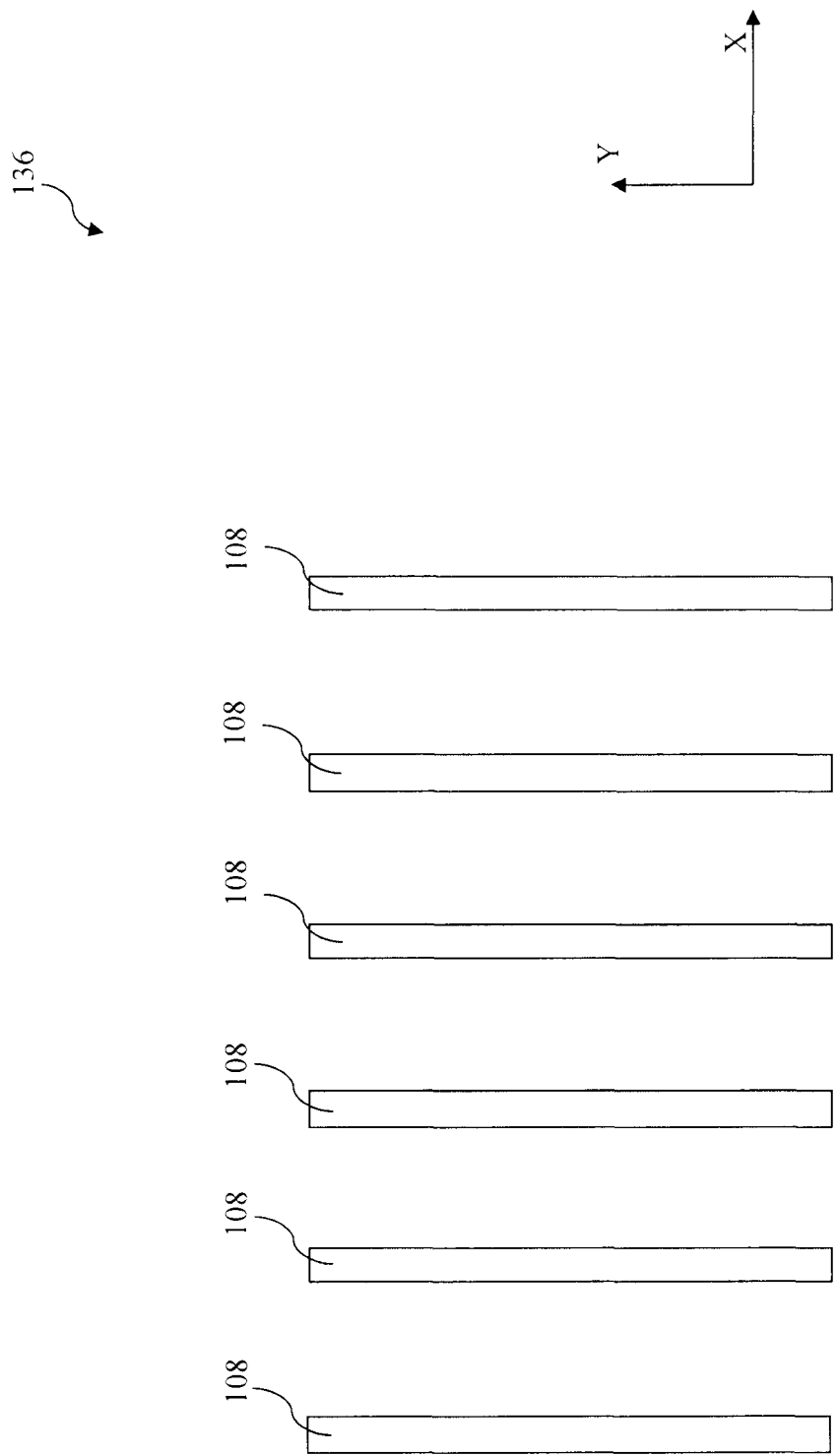

Referring to FIG. 17, the first spacer pattern 106 is removed by a procedure, such as the operation 30 of the method 20, thereby forming the second spacer pattern 108 having a periodic structure (regular structure) with a pitch P=S+c or P=(L+S)/2. In the above example, the pitch of the second spacer pattern 108 is about 60 nm.

More generally for the structure 136, those parameters are adjusted such that S<=2b and |L−S|=2c, the periodic structure of the second spacer pattern 108 has a pitch P=(L+S)/2.

FIGS. 18-22 are top views of a semiconductor structure 138 at various fabrication stages constructed according to another embodiment. Various mask parameters and processing parameters are determined according to the received IC layout by the method 120 and the fabrication of the semiconductor structure 138 is achieved by the method 20.

Figure 18:
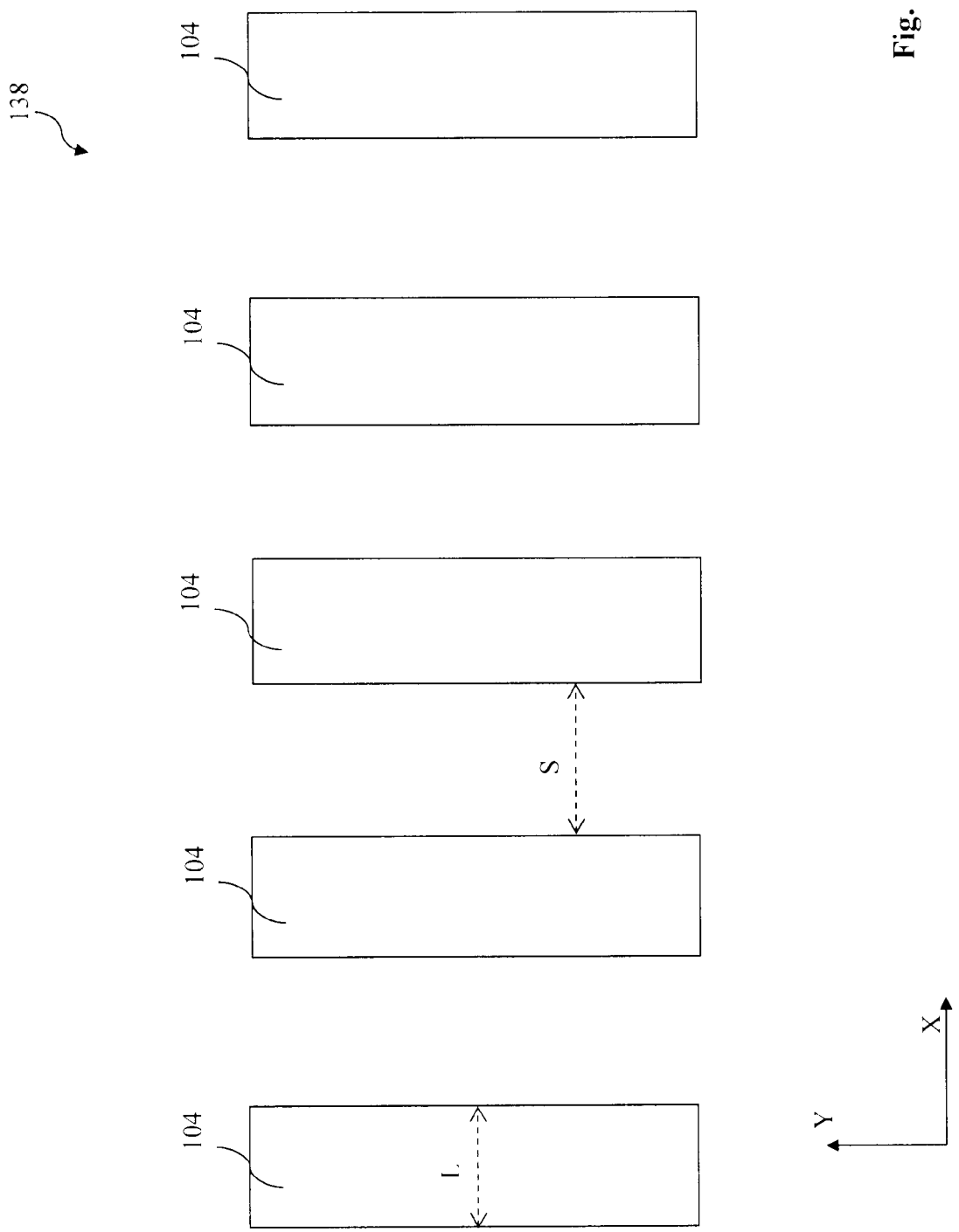
FIGS. 18-22 are top views of a semiconductor structure at various fabrication stages and constructed according to aspects of the present disclosure in one or more embodiments.

Referring to FIG. 18, a mandrel pattern 104 is formed on the substrate 102. The substrate 102 is not shown for simplicity. The mandrel pattern 104 includes a plurality of first features in a periodic configuration with the first width L and the first spacing S. In the present embodiment, the ratio L/S is equal to ½ or 0.5. In one example for illustration, the width L is about 48 nm and the spacing S is about 96 nm. The mandrel pattern 104 is formed by a procedure, such as the operation 22 of the method 20.

Figure 19:
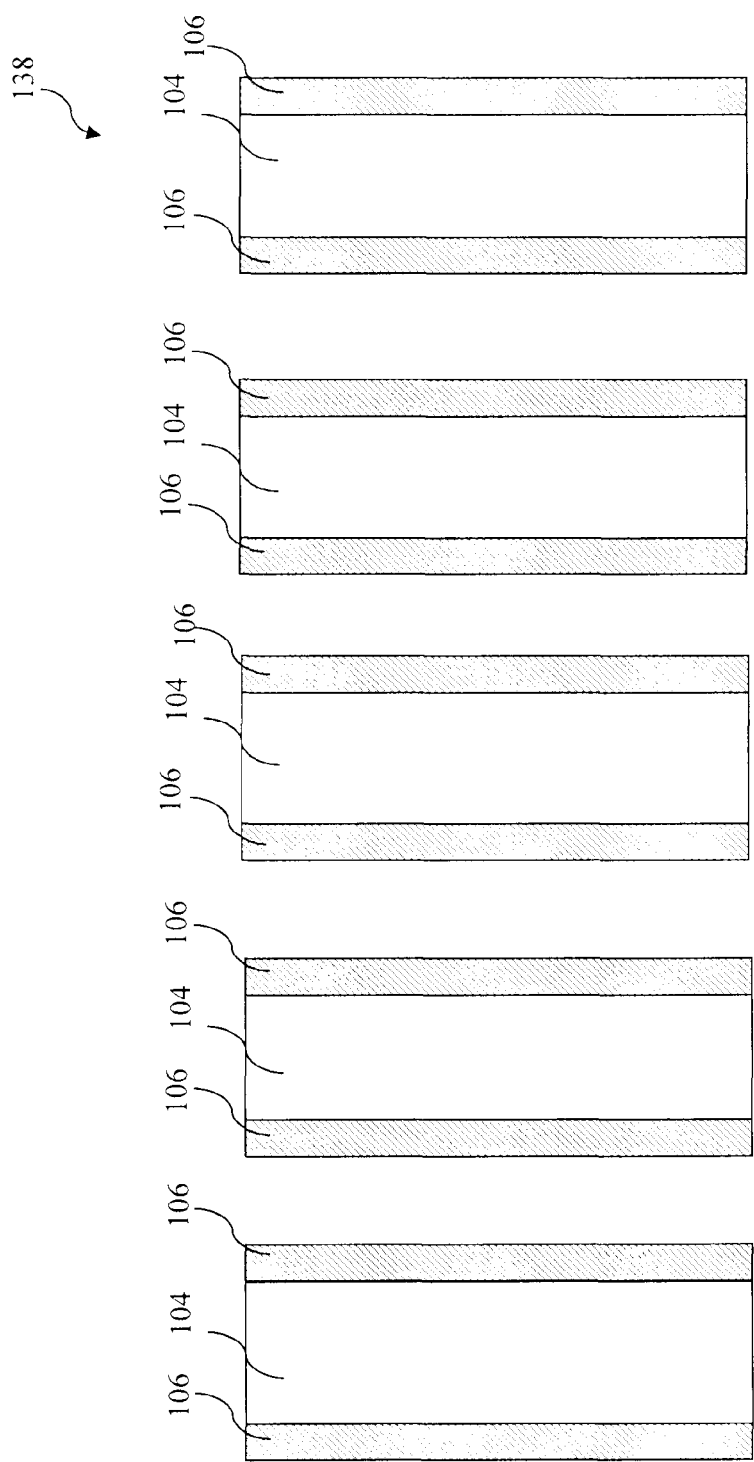

Referring to FIG. 19, the first spacer pattern 106 is formed on the sidewalls of the mandrel pattern 104 by a suitable procedure, such as the operation 24 of the method 20. Especially, the deposited thickness b of the first spacer material layer is equal to half of the first width L, formulated as b=L/2. In the above example, the deposited thickness b is about 24 nm.

Figure 20:
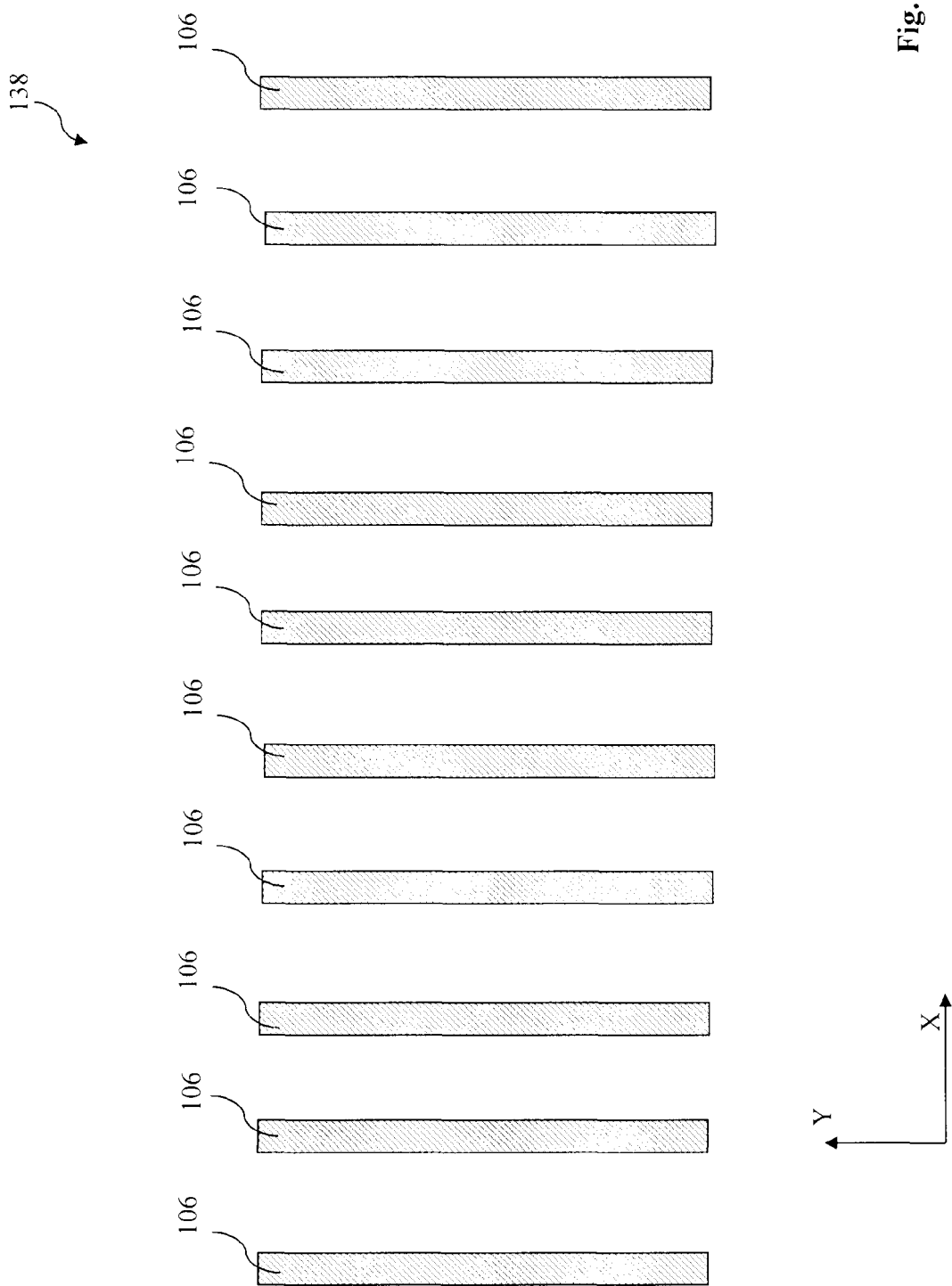

Referring to FIG. 20, the mandrel pattern 104 is removed by a procedure, such as the operation 26 of the method 20.

Figure 21:
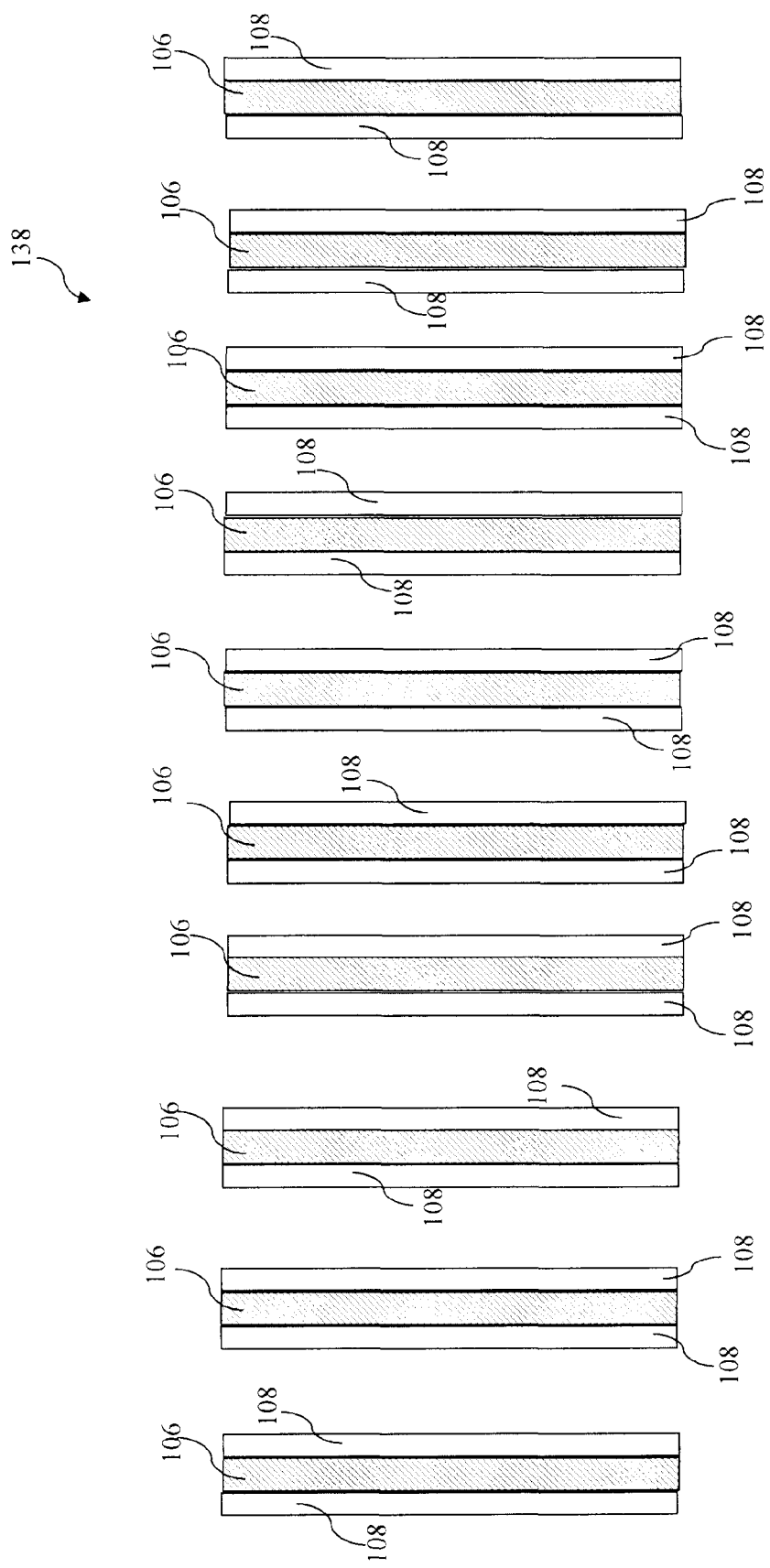

Referring to FIG. 21, the second spacer pattern 108 is formed on the sidewalls of the first spacer pattern 106 by a suitable procedure, such as the operation 28 of the method 20. Especially, the deposited thickness c of the second spacer material layer is equal to half of the first thickness b, formulated as c=b/2. In the above example, the deposited thickness c is about 12 nm.

Figure 22:
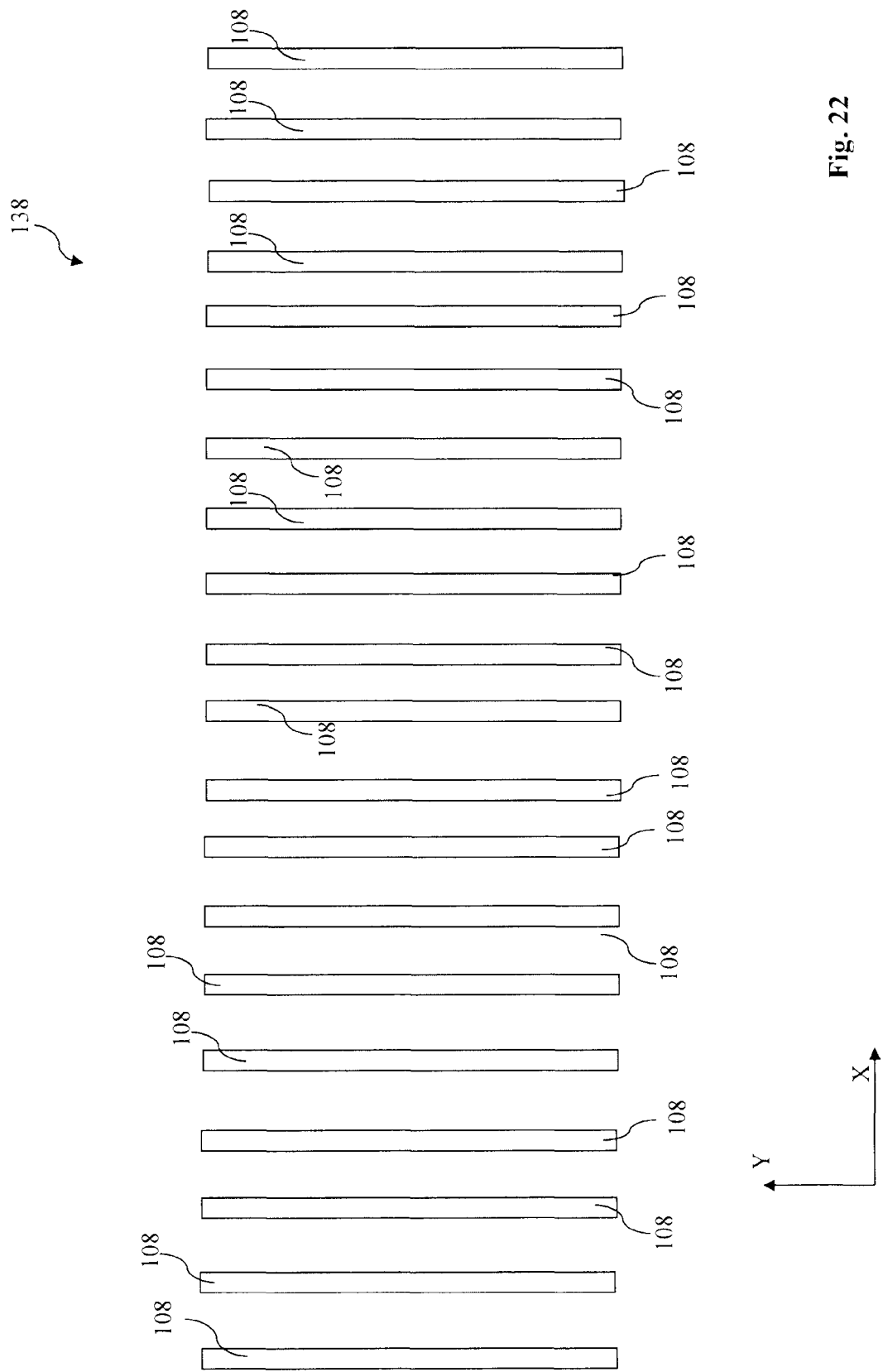

Referring to FIG. 22, the first spacer pattern 106 is removed by a procedure, such as the operation 30 of the method 20, thereby forming the second spacer pattern 108 having a periodic structure (regular structure) with a pitch P=b+c or P=(L+S)/4. In the above example, the pitch of the second spacer pattern 108 is about 36 nm.

FIGS. 23-29 are top views of a semiconductor structure 140 at various fabrication stages constructed according to another embodiment. Various mask parameters and processing parameters are determined according to the received IC layout by the method 120 and the fabrication of the semiconductor structure 140 is achieved by the method 20.

Figure 23:
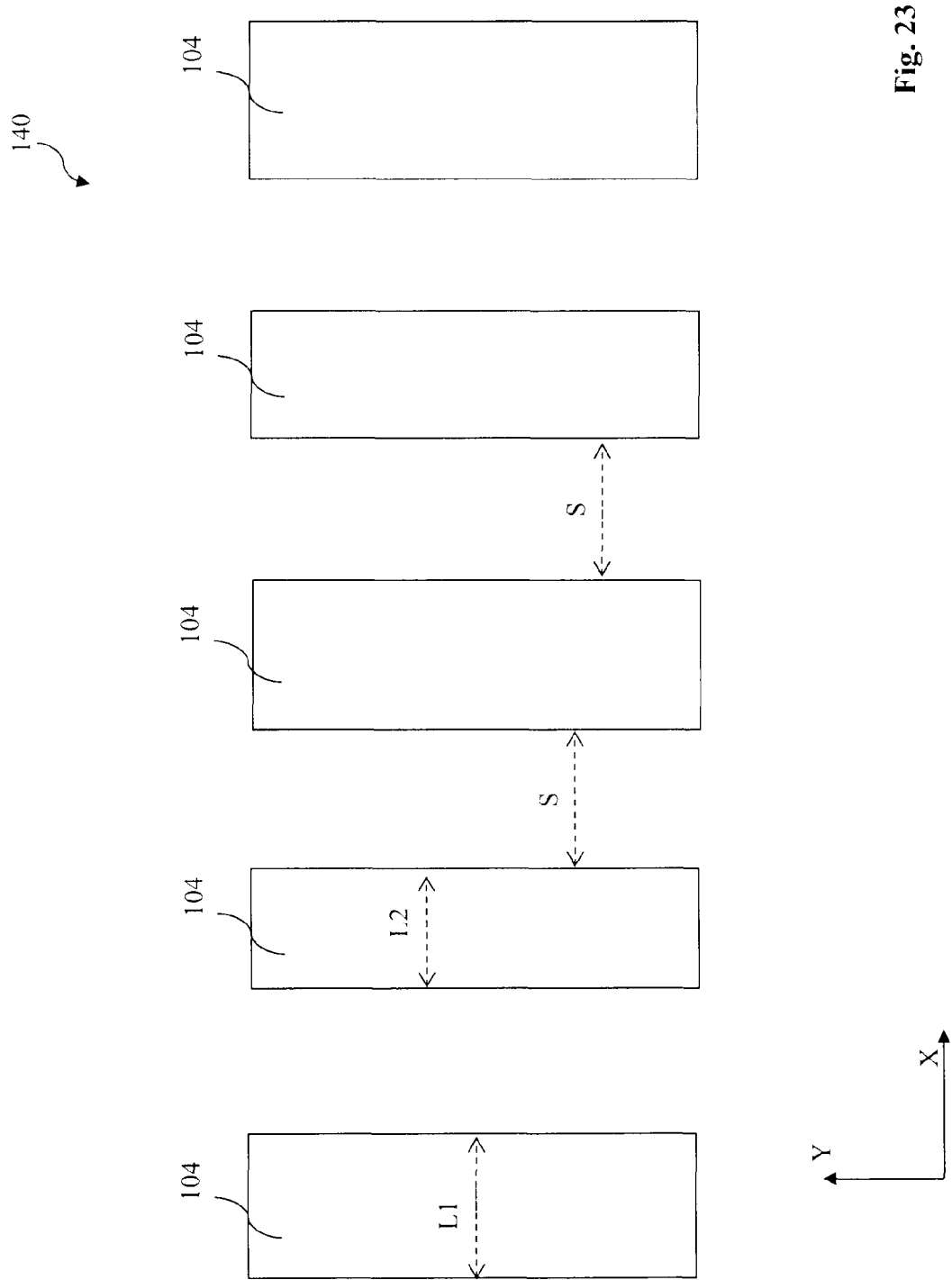
FIGS. 23-29 are top views of a semiconductor structure at various fabrication stages and constructed according to aspects of the present disclosure in one or more embodiments.

Referring to FIG. 23, a mandrel pattern 104 is formed on the substrate 102. The substrate 102 is not shown for simplicity. The mandrel pattern 104 includes a plurality of first features in a non-periodic configuration with the first spacing S. However, the first features include a first subset having one width L1 and a second subset having another width L2, as illustrated in FIG. 23. L1 is greater than L2. In the present embodiment, the ratio (L1−L2)/(L2−S) is equal to ½ or 0.5. In one example for illustration, the width L1 is about 106 nm. L2 is about 94 nm, and the spacing S is about 70 nm. The mandrel pattern 104 is formed by a procedure, such as the operation 22 of the method 20.

Figure 24:
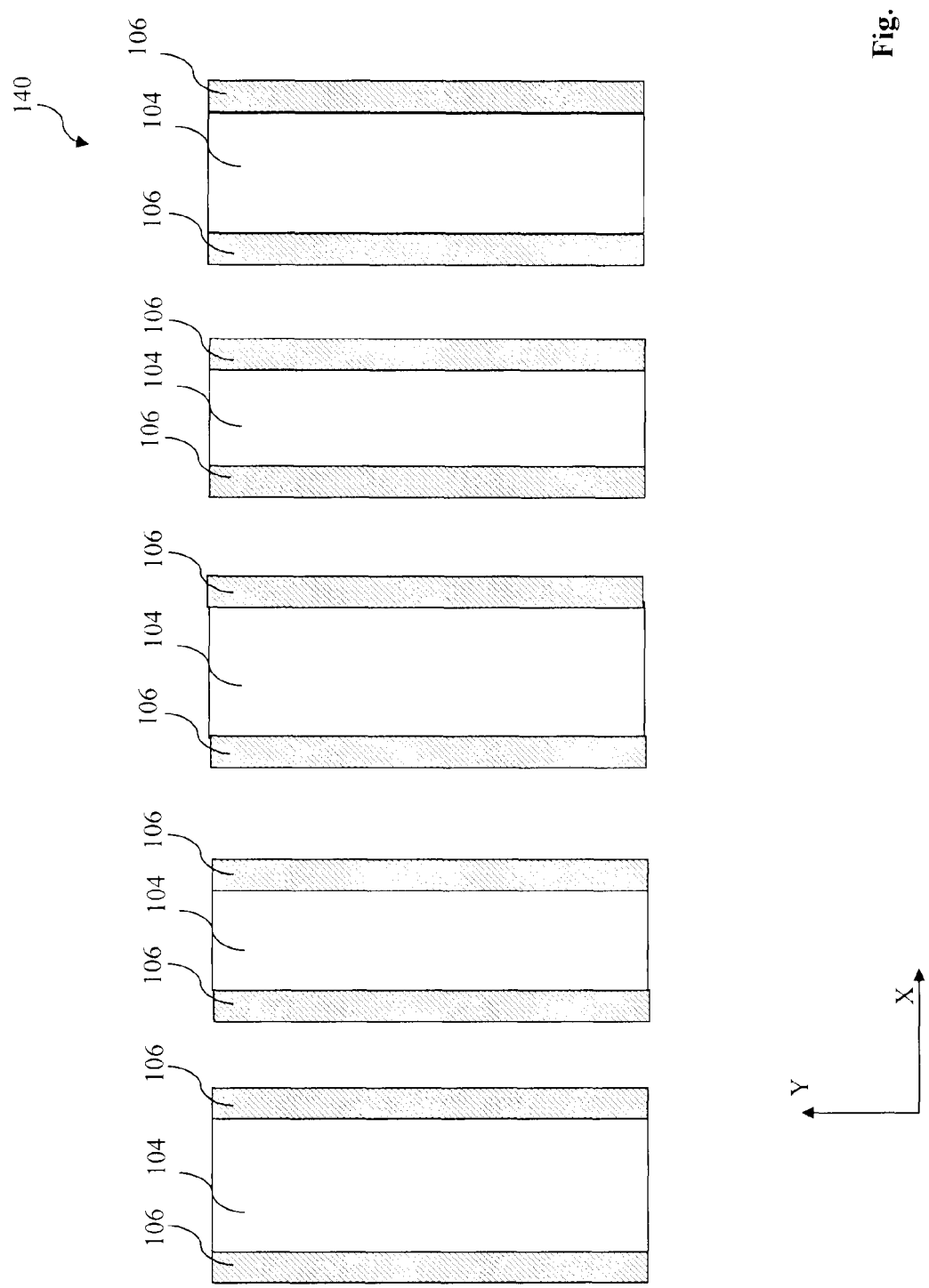

Referring to FIG. 24, the first spacer pattern 106 is formed on the sidewalls of the mandrel pattern 104 by a suitable procedure, such as the operation 24 of the method 20. In the present example, the deposited thickness b of the first spacer material layer is equal to L2−S. In the above example, the deposited thickness b is about 24 nm.

Figure 25:
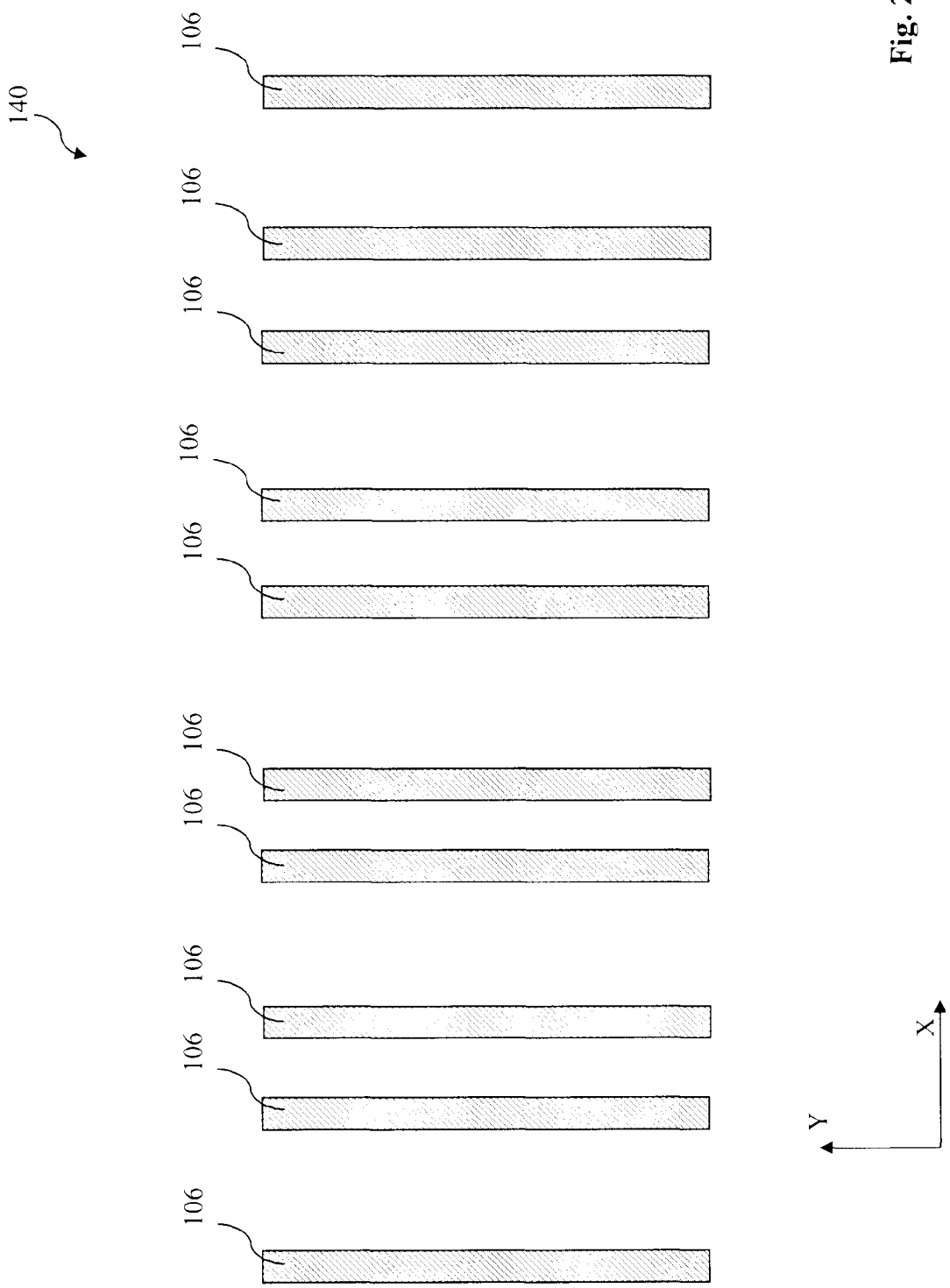

Referring to FIG. 25, the mandrel pattern 104 is removed by a procedure, such as the operation 26 of the method 20.

Figure 26:
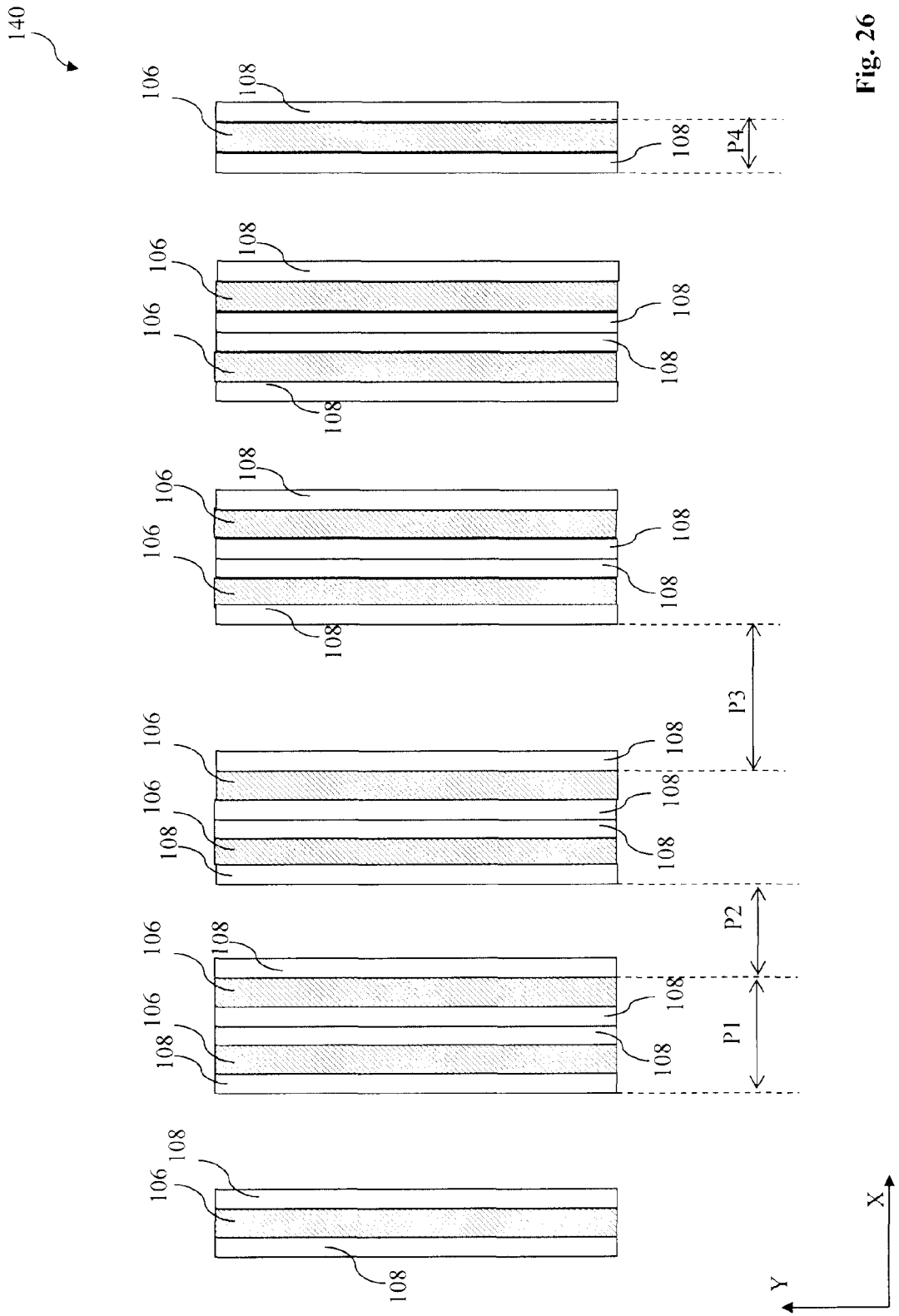

Referring to FIG. 26, the second spacer pattern 108 is formed on the sidewalls of the first spacer pattern 106 by a suitable procedure, such as the operation 28 of the method 20. Especially, the deposited thickness c of the second spacer material layer is equal to half of the first thickness b, formulated as c=b/2. In this case, some of the third features in the second spacer pattern 108 are merged together, as illustrated in FIG. 26. In the above example, the deposited thickness c is about 12 nm. The second spacer pattern 108 has various pitches, such as the pitches P1, P2, P3, and P4 illustrated in FIG. 26, respectively. Particularly, P1=S+c; P2=L2−c; P3=L1−c; and P4=b+c. The merged third features are not considered in defining various pitches since these will be removed in the subsequent operations. In the above example, P1=70 nm+12 nm=82 nm; P2=94 nm−12 nm=82 nm; P3=106 nm−12 nm=94 nm; and P4=24 nm+12 nm=36 nm.

Figure 27:
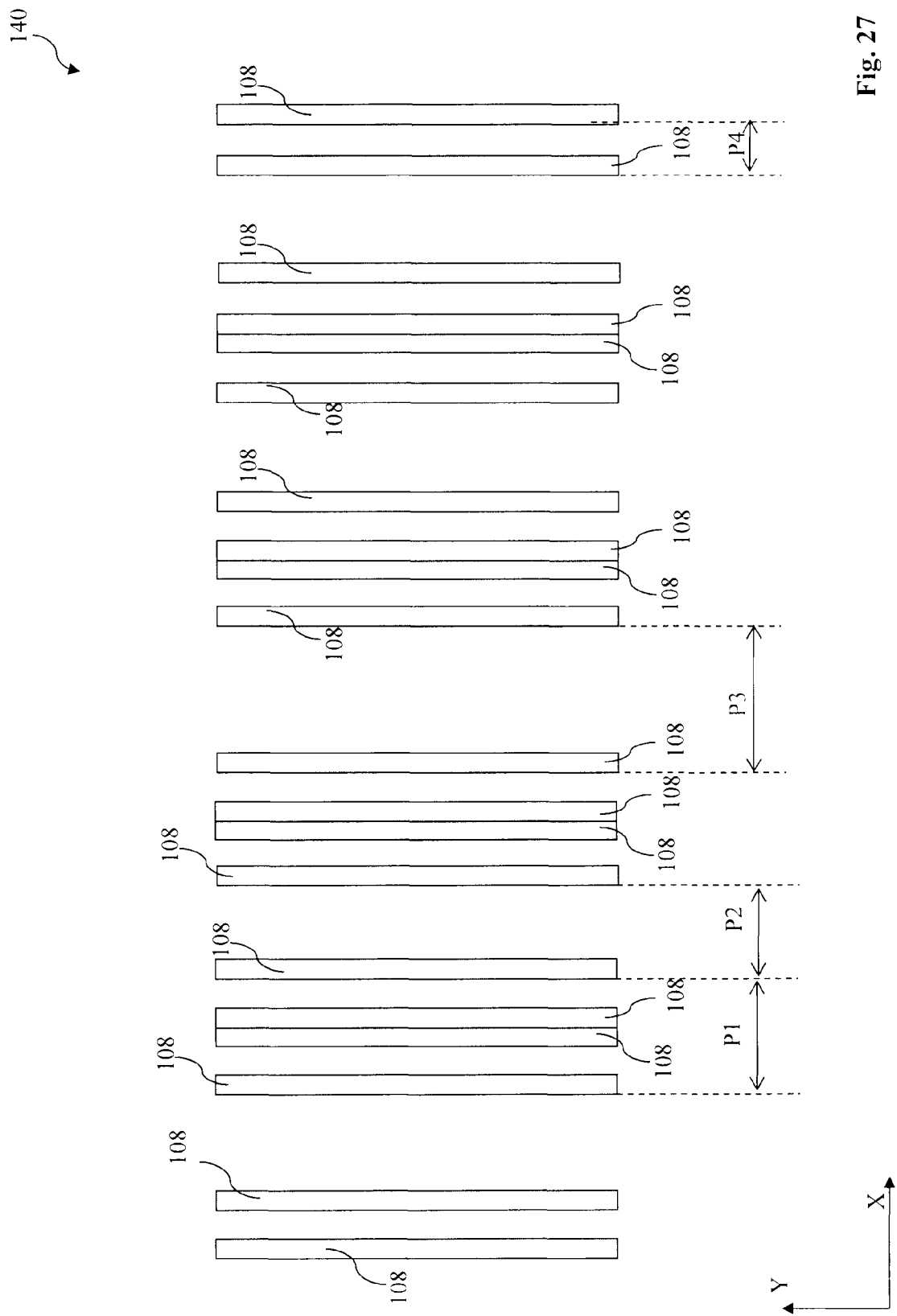

Referring to FIG. 27, the first spacer pattern 106 is removed by a procedure, such as the operation 30 of the method 20.

Figure 28:
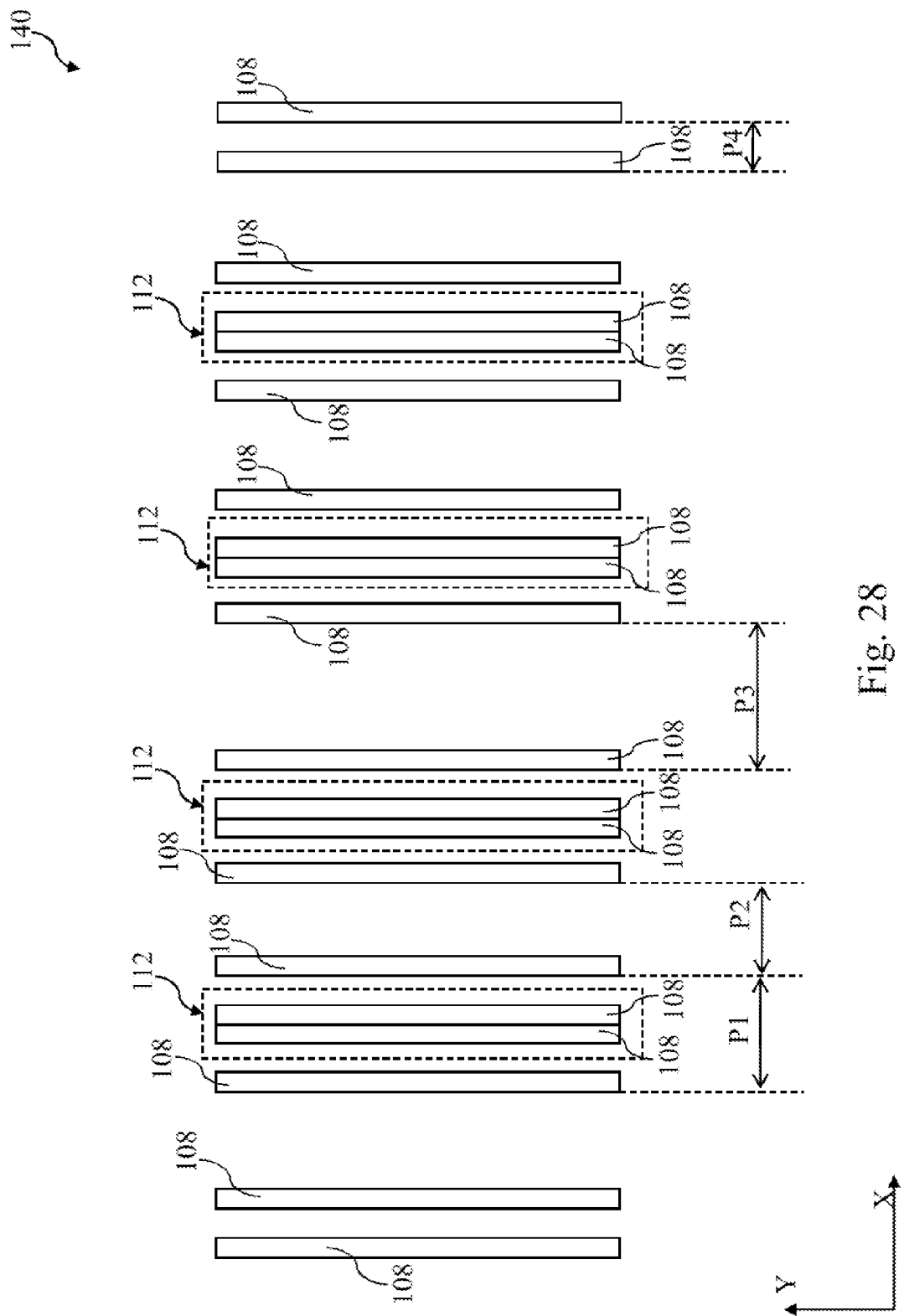

Referring to FIG. 28, a cut pattern 110 is formed on the substrate 102 and the second spacer pattern 108 by a procedure, such as the operation 32 of the method 20. The cut pattern 110 includes various openings 112 that define the portion of the second spacer pattern 108 to be removed. In the present embodiment, the openings 112 are aligned with the merged third features.

Figure 29:
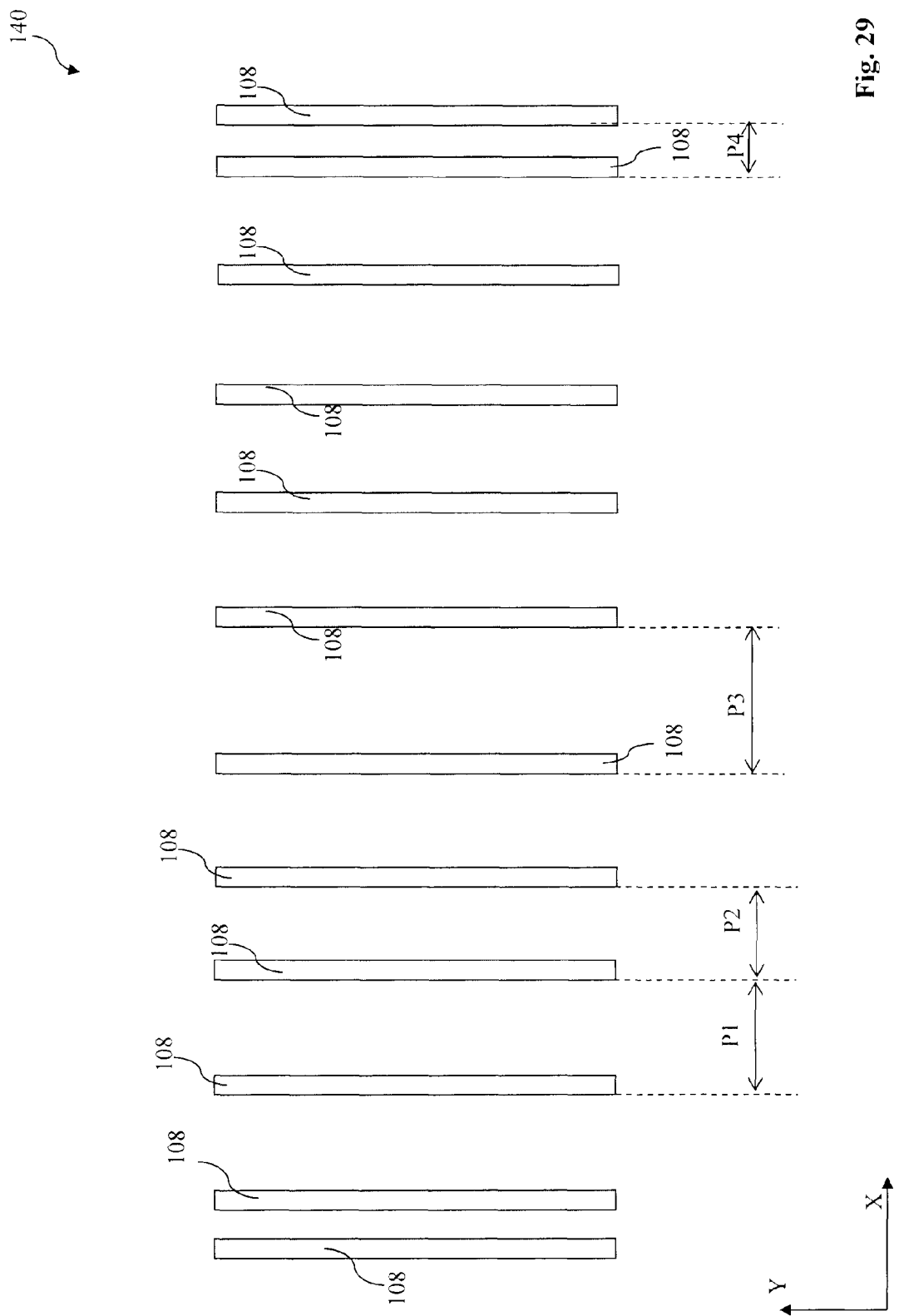

Referring to FIG. 29, portions of the second spacer pattern 108 within the openings 112 of the cut pattern 110 are removed by a procedure, such as the operation 34 of the method 20, thereby forming the final structure of the second spacer pattern 108 having an irregular structure with various pitches.

FIGS. 30-36 are top views of a semiconductor structure 142 at various fabrication stages constructed according to another embodiment. Various mask parameters and processing parameters are determined according to the received IC layout by the method 120 and the fabrication of the semiconductor structure 142 is achieved by the method 20.

Figure 30:
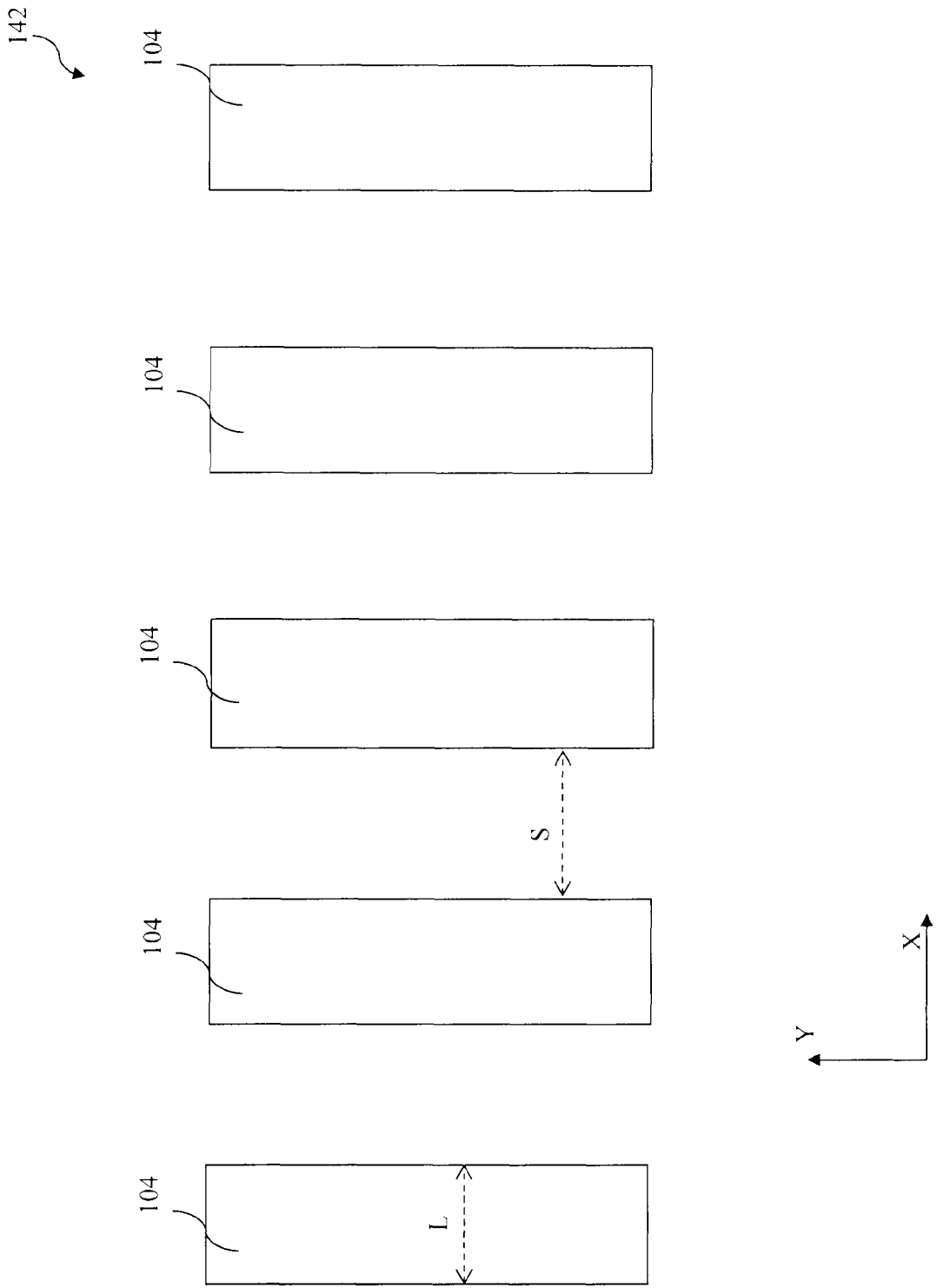
FIGS. 30-36 are top views of a semiconductor structure at various fabrication stages and constructed according to aspects of the present disclosure in one or more embodiments.

Referring to FIG. 30, a mandrel pattern 104 is formed on the substrate 102. The mandrel pattern 104 includes a plurality of first features in a periodic configuration with the width L and the spacing S.

Figure 31:
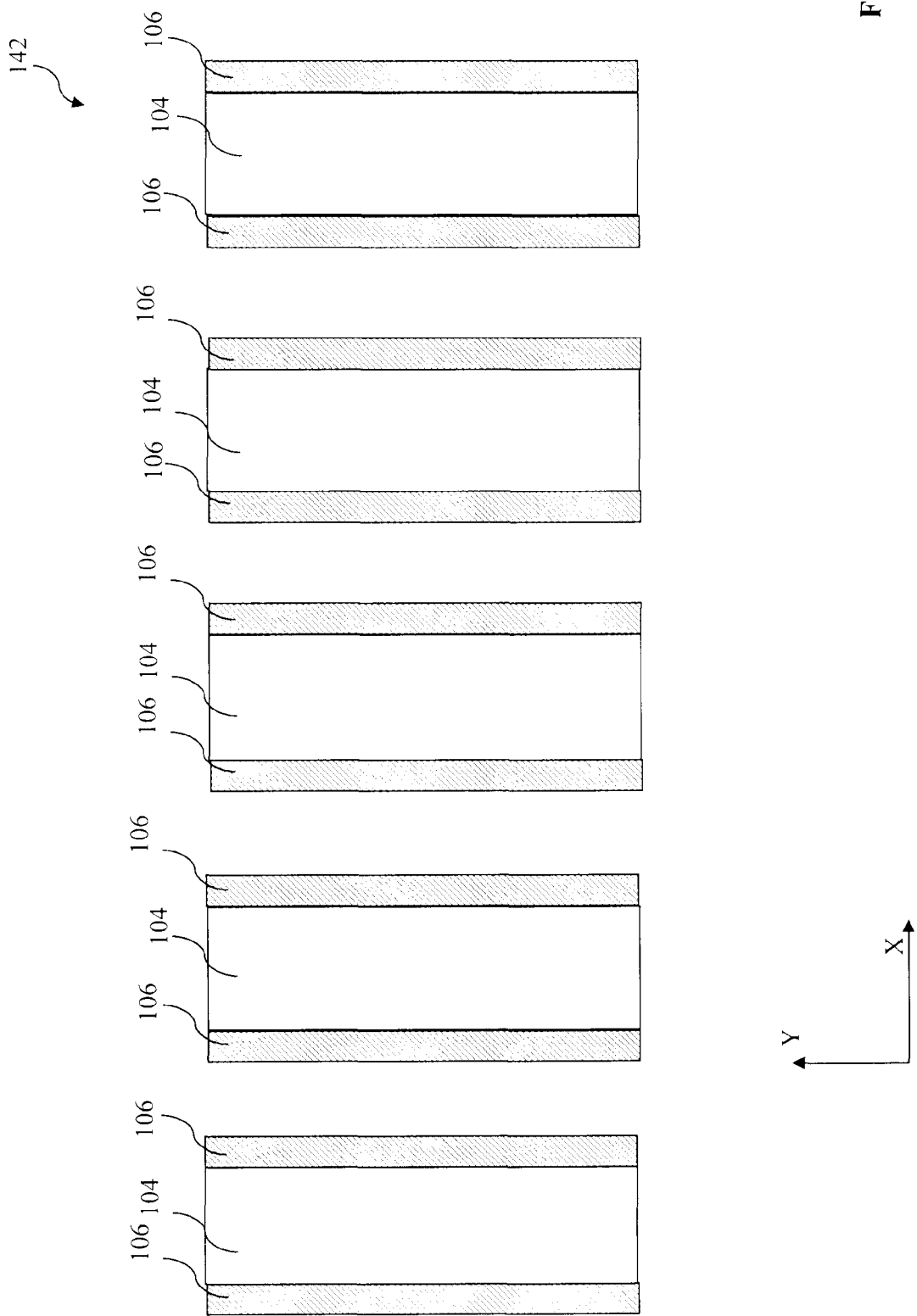

Referring to FIG. 31, the first spacer pattern 106 is formed on the sidewalls of the mandrel pattern 104 by a suitable procedure, such as the operation 24 of the method 20.

Figure 32:
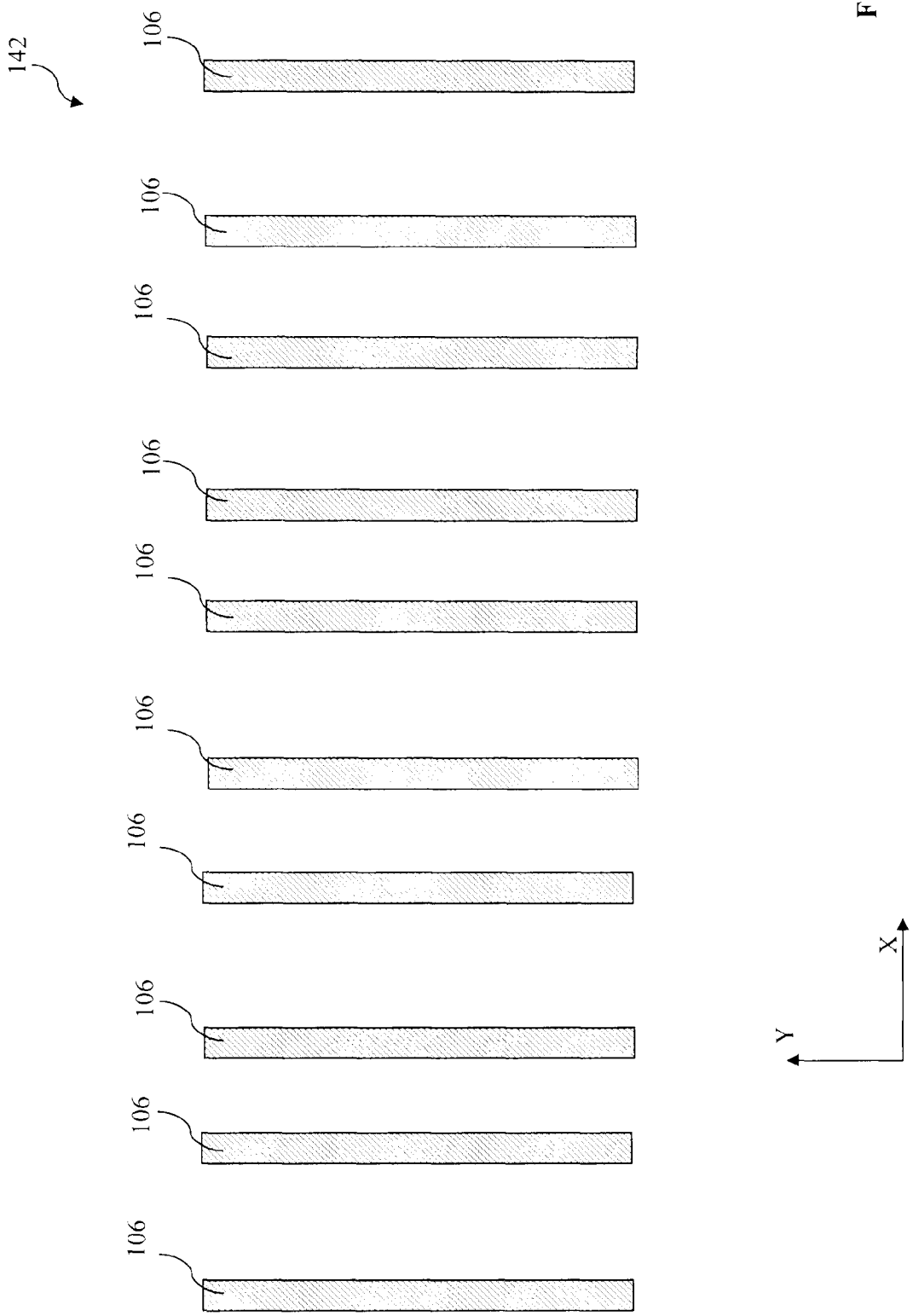

Referring to FIG. 32, the mandrel pattern 104 is removed by a procedure, such as the operation 26 of the method 20.

Figure 33:
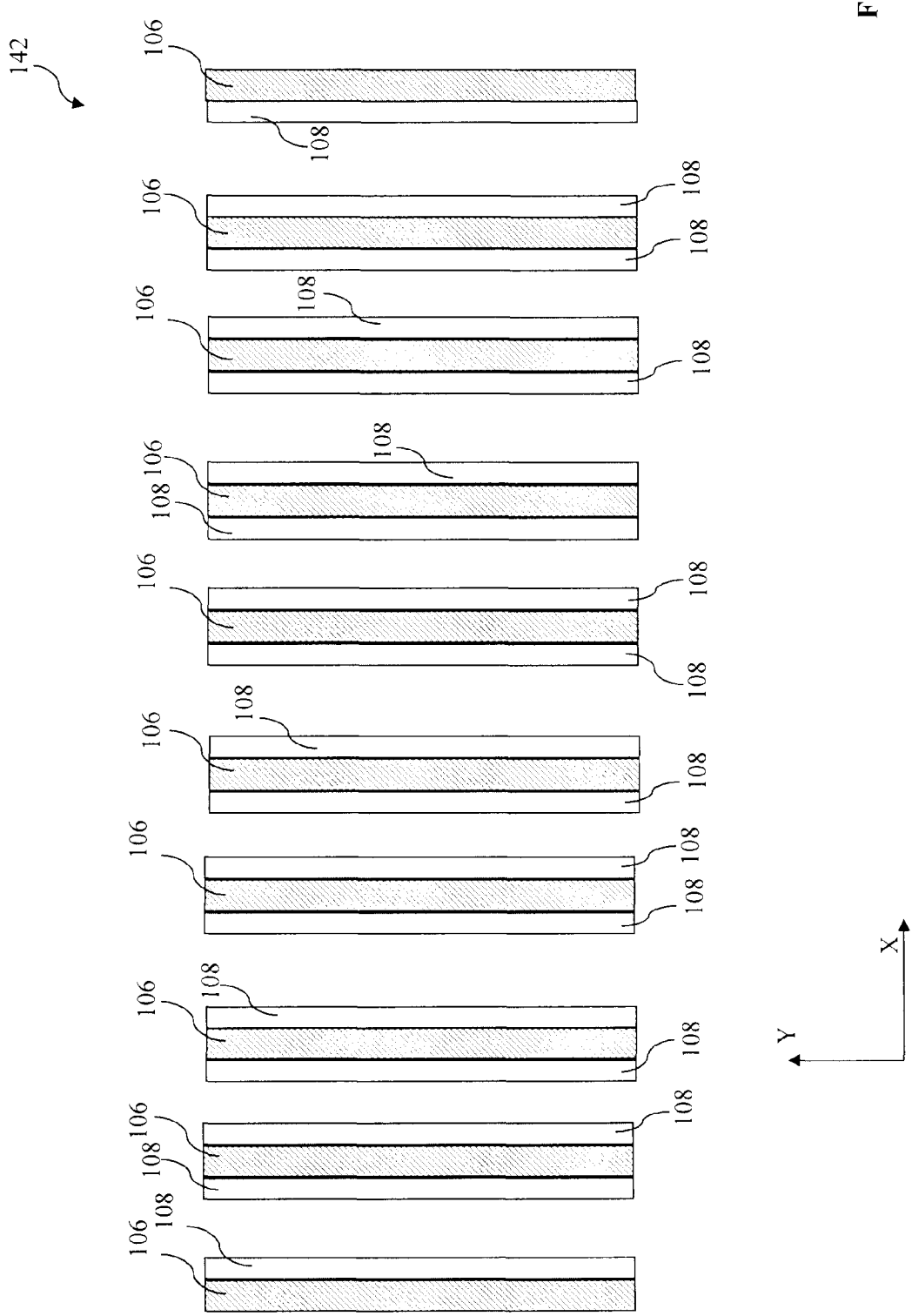

Referring to FIG. 33, the second spacer pattern 108 is formed on the sidewalls of the first spacer pattern 106 by a suitable procedure, such as the operation 28 of the method 20.

Figure 34:
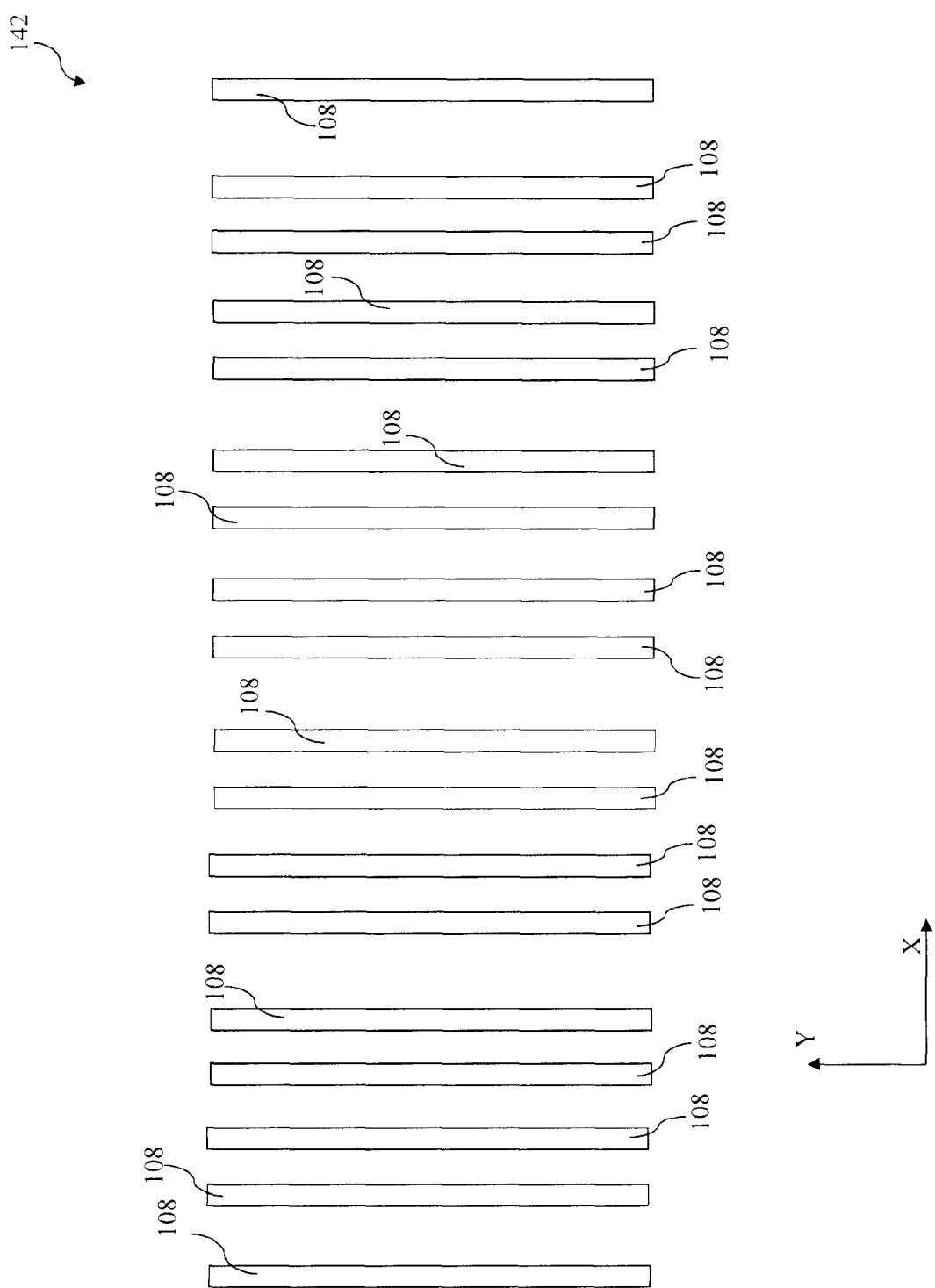

Referring to FIG. 34, the first spacer pattern 106 is removed by a procedure, such as the operation 30 of the method 20.

Figure 35:
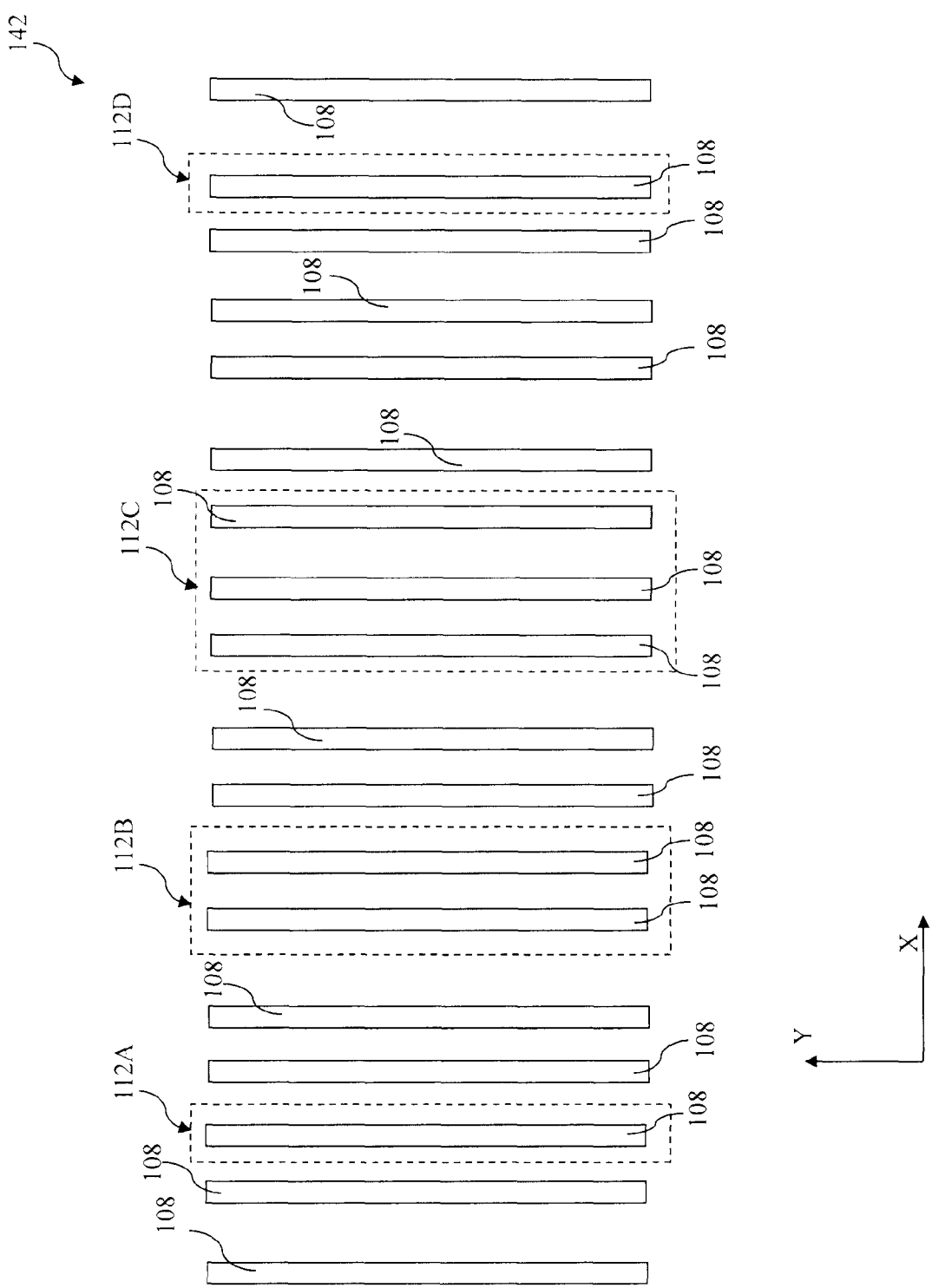

Referring to FIG. 35, a cut pattern 110 is formed on the substrate 102 and the second spacer pattern 108 by a procedure, such as the operation 32 of the method 20. The cut pattern 110 includes various openings 112 that define the portion of the second spacer pattern 108 to be removed. In the present embodiment, the cut pattern 110 has an irregular structure with various openings of respective width and spacing. As illustrated in FIG. 35, the opening 112A has a first width such that only one feature of the second spacer pattern 108 is exposed therewithin. The opening 112B has a second width such that two features of the second spacer pattern 108 are exposed therewithin. The opening 112C has a third width such that three features of the second spacer pattern 108 are exposed therewithin. The cut pattern 110 may have other openings with various dimensions. Furthermore, the distances between the adjacent openings may vary over different locations. For example, the spacing between the second opening 112B and the third opening 112C is different from the spacing between the third opening 112C and the fourth opening 112D.

Figure 36:
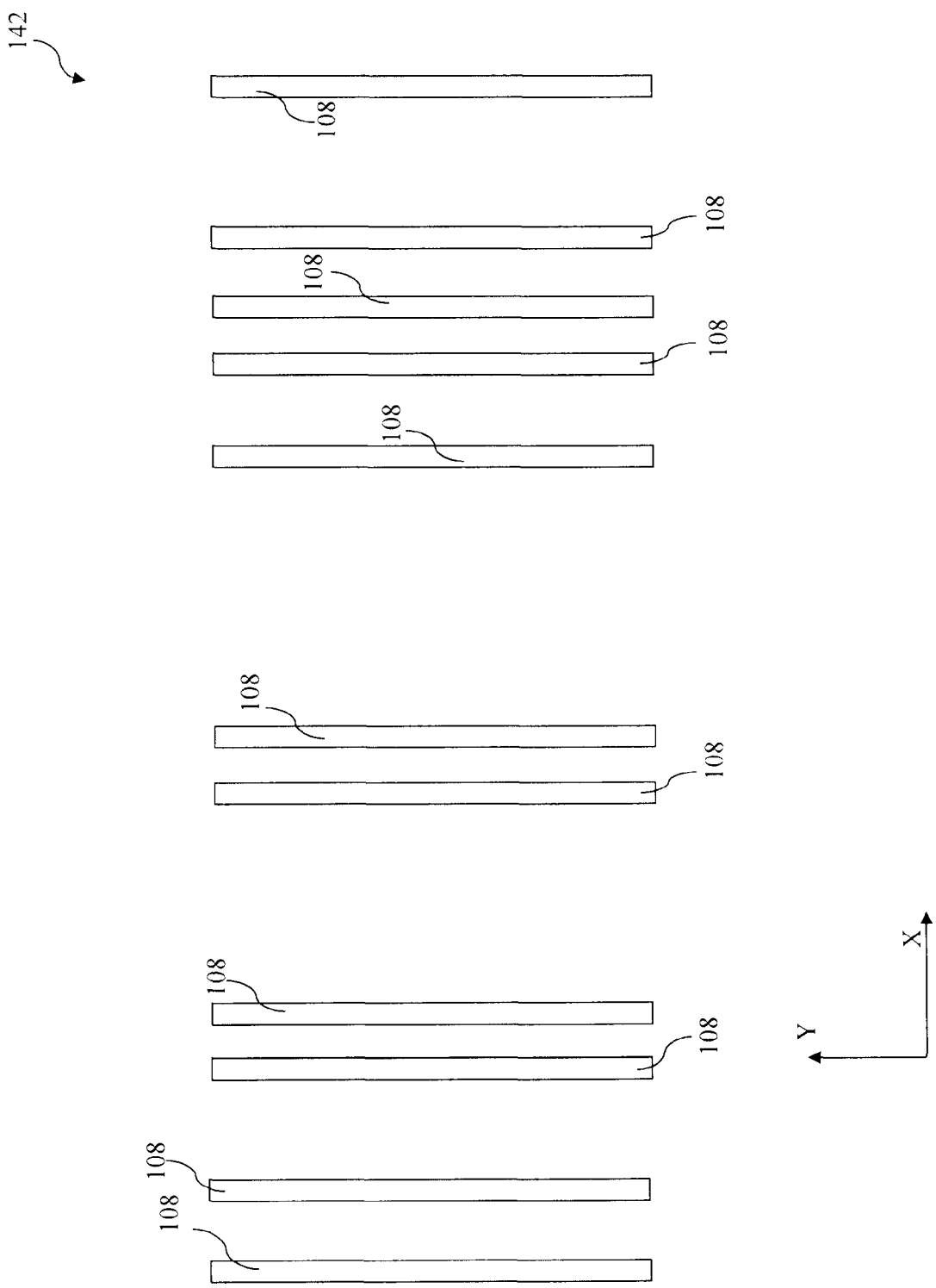

Referring to FIG. 36, portions of the second spacer pattern 108 within the openings 112 of the cut pattern 110 are removed by a procedure, such as the operation 34 of the method 20, thereby forming the final structure of the second spacer pattern 108 having an irregular structure with various pitches.

Figure 38:
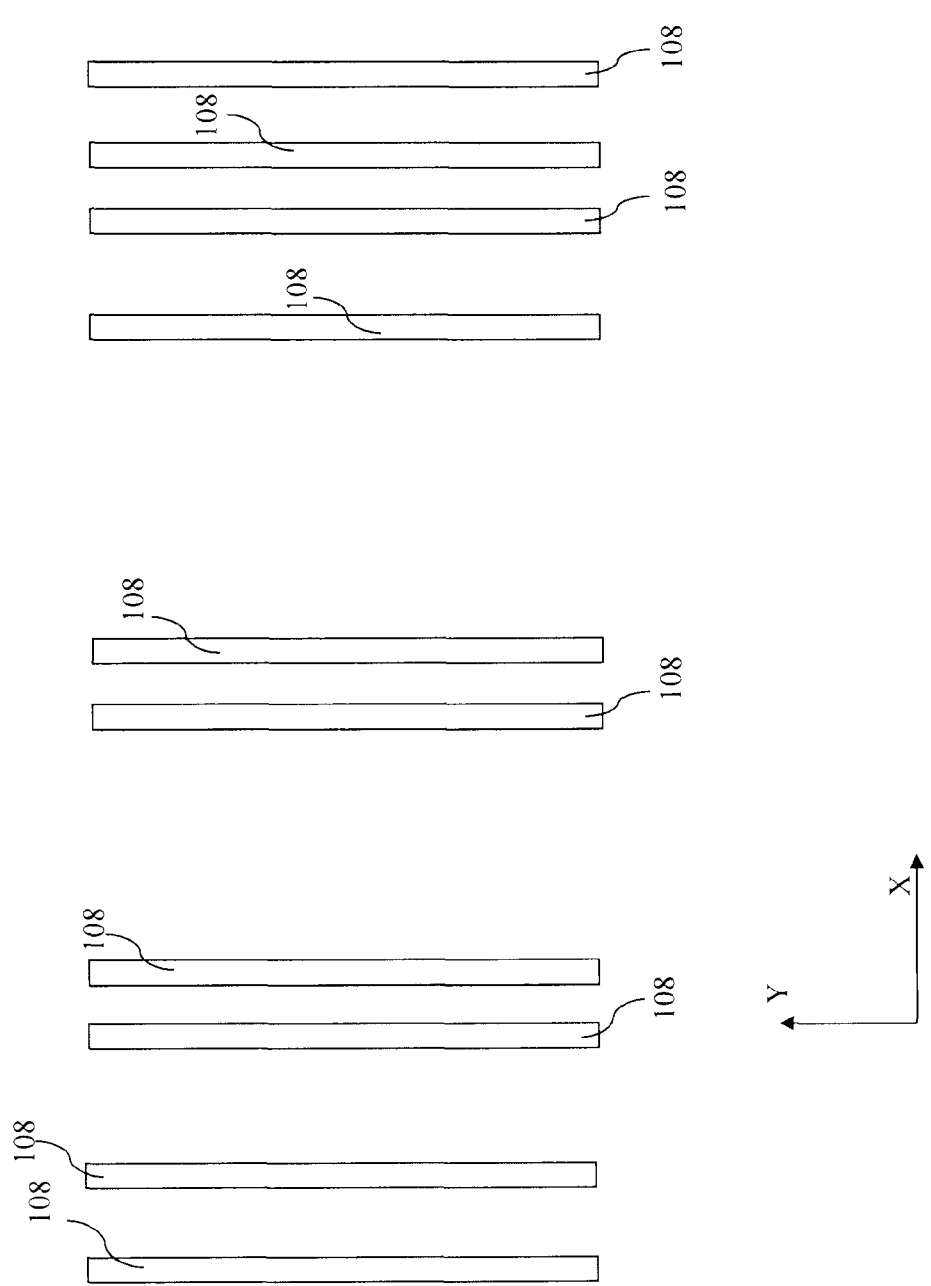

FIGS. 37-38 are top views of a semiconductor structure 144 at various fabrication stages constructed according to another embodiment. Various mask parameters and processing parameters are determined according to the received IC layout by the method 120 and the fabrication of the semiconductor structure 144 is achieved by the method 20.

The procedure to form the semiconductor structure 144 is similar to the procedure to form the semiconductor structure 142 where an irregular cut pattern 110 is used to achieve the final structure of the second spacer pattern 108 with various pitches and configuration. In addition to that, the mandrel pattern 104 in the semiconductor structure 144 is further defined to another irregular structure, as illustrated in FIG. 37. For example, the mandrel pattern 104 in FIG. 37 includes various widths, such as L1, L2 and L3 different from each other.

The mandrel pattern 104 is defined by the mandrel mask and is formed by the first lithography process. The cut pattern 110 is defined by the cut mask and is formed by the second lithography process. By combining the first irregular pattern in the mandrel mask and the second irregular pattern in the cut mask, more complicated structure of the second spacer pattern 108 is formed on the substrate 102, as illustrated in FIG. 38. Thus, the method provides more freedom to tune the final structure of the second spacer pattern 108.

Figure 39:
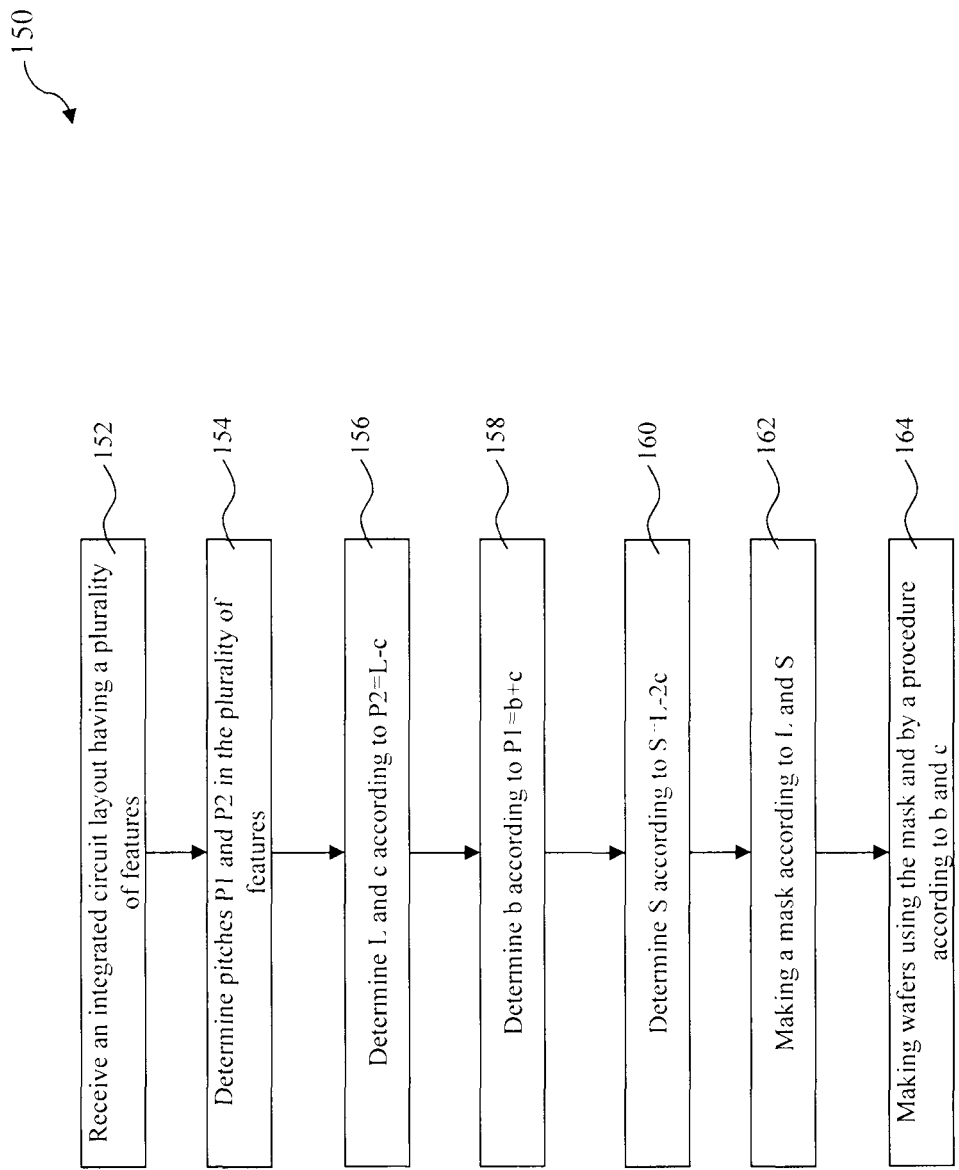
FIG. 39 is a flowchart of another embodiment of an IC method constructed according to aspects of the present disclosure.

FIG. 39 is a flowchart of a method 150 for making an IC pattern. Furthermore, the method 150 is used to determine various parameters and is combined with the method 20 to form an IC pattern with various structures, especially various irregular structures. For example, the method 150 is implemented to determine the mask and processing parameters; and the method 20 is implemented to form an IC pattern according to the parameters determined by the method 150. The method 150 may be one example of the method 120. The method 150 is described with reference to FIGS. 39, 11 and other figures.

The method 150 begins at operation 152 by receiving an IC layout having a plurality of third features, such as the second spacer pattern 108 in FIG. 9 that may define various fin-like active regions in the substrate 102. In the present embodiment, the IC layout has two pitches P1 and P2.

The method 150 may proceed to an operation 154 by determining respective values of the pitches in the third features 108. Those values may be directly extracted from the IC layout. In the present example, the pitches P1 and P2 are determined.

The method 150 proceeds to an operation 156 by determining the mask parameter L and the processing parameter c based on the IC layout, specifically based on the respective pitches P1 and P2. In the present example, the first pitch P1=b+c and the second pitch P2=L−c, as illustrated in FIG. 11. Based on the formula P2=L−c, the parameters L and c are determined.

The method 150 proceeds to an operation 158 by determining the processing parameter b based on the IC layout, specifically based on the respective pitch P1. In the present example, based on the first pitch P1=b+c, the parameters b is determined.

The method 150 proceeds to an operation 160 by determining the mask parameter S based on the IC layout, specifically based on the spatial relationship S=L−2c, which means to require that the third pitch P3=P2. Since P2=L−c and P3=S+c, as illustrated in FIG. 11, P2=P3 gives the condition S=L−2c. Based on the formula S=L−2c, the parameter S is determined.

The method 150 may proceed to an operation 162 by making mask according to the IC pattern and determined mask parameters including L and S. The operation 162 may include generating the mandrel pattern according to the determined mask parameters and making the mask defining the mandrel pattern. The operation 162 may further include generating the cut pattern according to the determined mask parameters and making the mask defining the cut pattern. A mask may be a binary mask, a phase shift mask, a reflective mask or other suitable mask.

The method 150 may proceed to an operation 164 by fabricating wafers based on the determined processing parameters and using the masks during the respective lithography processes. In the present embodiment, the operation 164 includes the method 20. For example, the operation 164 includes forming the mandrel pattern 104 by the first lithography process using the mask designed according to the mask parameters L and S; forming the first spacer pattern 106 by a procedure that includes depositing the first spacer material layer with a first thickness according to the determined processing parameter b; and forming the second spacer pattern 108 by a procedure that includes depositing the second spacer material layer with a second thickness according to the determined processing parameter c.

The operation 164 may further include forming the cut pattern 110 by the second lithography process using the mask designed according to the mask parameters associated with the cut pattern such as respective width and spacer of the cut features in the cut pattern.

Figure 40:
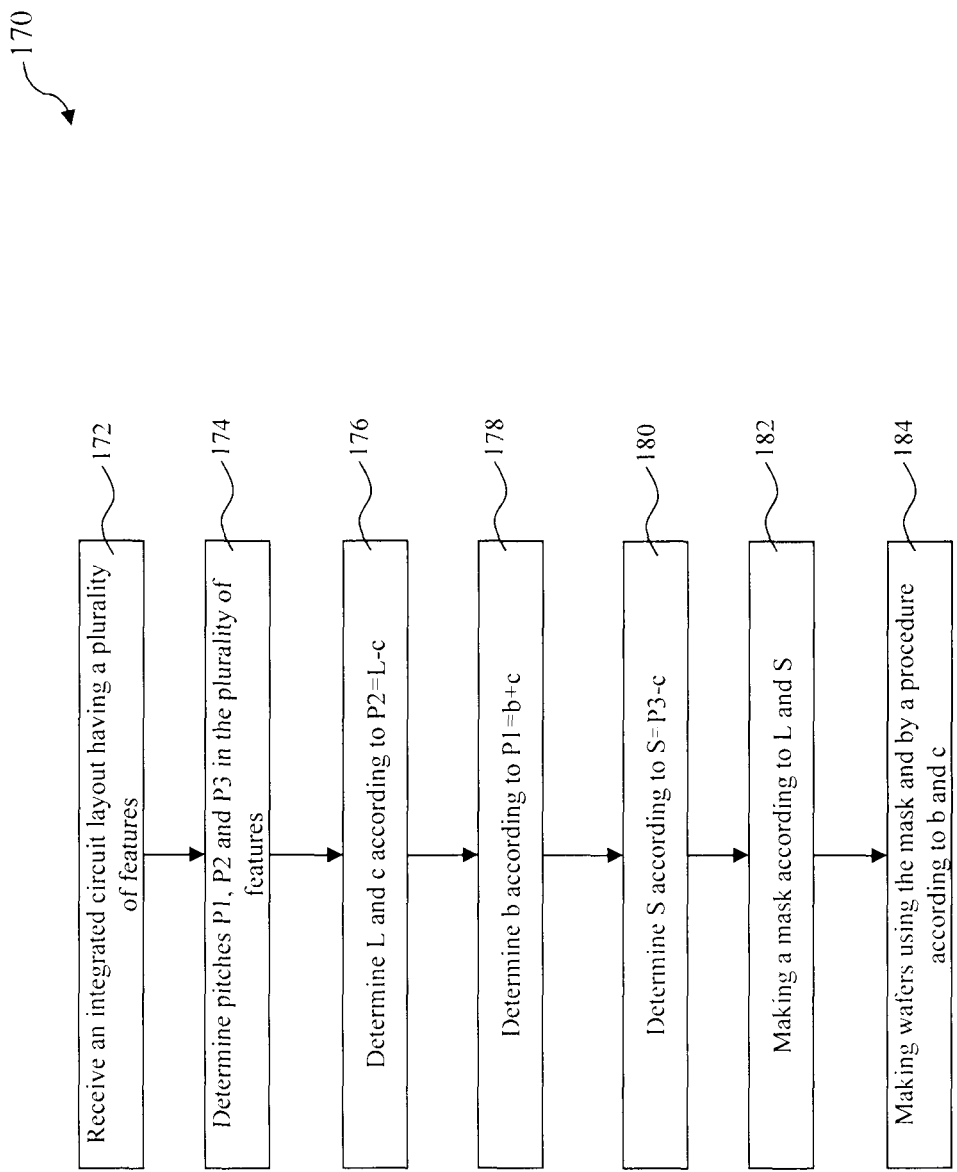
FIG. 40 is a flowchart of another embodiment of an IC method constructed according to aspects of the present disclosure.

FIG. 40 is a flowchart of a method 170 for making an IC pattern. Furthermore, the method 170 is used to determine various parameters and is combined with the method 20 to form an IC pattern with various structures, especially various irregular structures. For example, the method 170 is implemented to determine the mask and processing parameters; and the method 20 is implemented to form an IC pattern according to the parameters determined by the method 170. The method 170 may be one example of the method 120. The method 170 is described with reference to FIGS. 40, 11 and other figures.

The method 170 begins at operation 172 by receiving an IC layout having a plurality of third features, such as the second spacer pattern 108 in FIG. 9 that may define various fin-like active regions in the substrate 102. In the present embodiment, the IC layout has two pitches P1, P2 and P3.

The method 170 may proceed to an operation 174 by determining respective values of the pitches in the third features 108. Those values may be directly extracted from the IC layout. In the present example, the pitches P1, P2 and P3 are determined.

The method 170 proceeds to an operation 176 by determining the mask parameter L and the processing parameter c based on the IC layout, specifically based on the respective pitches P1 and P2. In the present example, the first pitch P1=b+c, the second pitch P2=L−c, and P3=S+c (assuming that the third features of the second spacer pattern 108 within the gap between two adjacent first features of the mandrel pattern 104 are removed by etching through the openings 112 of the cut pattern 110). Otherwise, P3=S−2b−c, as illustrated in FIG. 11. Based on the formula P2=L−c, the parameters L and c are determined.

The method 170 proceeds to an operation 178 by determining the processing parameter b based on the IC layout, specifically based on the respective pitch P1. In the present example, based on the first pitch P1=b+c, the parameters b is determined.

The method 170 proceeds to an operation 180 by determining the mask parameter S based on the IC layout, specifically based on the respective pitch P3. In the present example, based on the third pitch P3=S+c, the parameters S is determined. Otherwise if the cut pattern 110 is not implemented to remove the third features within the gap between the adjacent third features of the mandrel pattern 104, the parameters S is determined based on the formula P3=S−2b−c.

The method 170 may proceed to an operation 182 by making mask according to the IC pattern and determined mask parameters including L and S. The operation 182 may include generating the mandrel pattern according to the determined mask parameters and making the mask defining the mandrel pattern. The operation 182 may further include generating the cut pattern according to the determined mask parameters and making the mask defining the cut pattern. A mask may be a binary mask, a phase shift mask, a reflective mask or other suitable mask.

The method 170 may proceed to an operation 184 by fabricating wafers based on the determined processing parameters and using the masks during the respective lithography processes. In the present embodiment, the operation 184 includes the method 20. For example, the operation 184 includes forming the mandrel pattern 104 by the first lithography process using the mask designed according to the mask parameters L and S; forming the first spacer pattern 106 by a procedure that includes depositing the first spacer material layer with a first thickness according to the determined processing parameter b; and forming the second spacer pattern 108 by a procedure that includes depositing the second spacer material layer with a second thickness according to the determined processing parameter c.

The operation 184 may further include forming the cut pattern 110 by the second lithography process using the mask designed according to the mask parameters associated with the cut pattern such as respective width and spacer of the cut features in the cut pattern.

By using the disclosed method, a complicated IC pattern is formed by the method 20 through tuning various mask and processing parameters, which is further achieved by the method 120. Especially, a pattern with a non-periodic (irregular) structure with multiple pitches is able to be formed by disclosed method. Other advantages may present in different embodiments. For example, by implementing the disclosed method, a complicated structure is formed with less fabrication steps and/or a lower resolution lithography system, therefore reducing the manufacturing cost. Other embodiments and modifications may be implemented without departing from the spirit of the present disclosure. In one embodiment, instead of forming fin-like active regions by the disclosed method, formed may be other IC features, such as a plurality of gate electrodes for field effect transistors, or metal lines for interconnect structure.

Thus, the present disclosure provides an integrated circuit (IC) design method. The method includes forming a mandrel pattern on a substrate by a first lithography process; forming a first spacer pattern on sidewalls of the mandrel pattern; removing the mandrel pattern; forming a second spacer pattern on sidewalls of the first spacer pattern; removing the first spacer pattern; and etching the substrate using the second spacer pattern as an etch mask.

The present disclosure also provides another embodiment of a method for integrated circuit (IC). The method includes receiving an IC layout having a plurality of features; determining pitches in the plurality of features; determining mask parameters and processing parameters based on the pitches in the features; and fabricating a mask according to the mask parameters.

The present disclosure also provides another embodiment of a method for integrated circuit (IC). The method includes receiving an IC layout having a plurality of features having a first pitch P1 and a second pitch P2 being different from each other; determining a first processing parameter c according to P2=L−c, wherein L is a first width of the features; and determining a second processing parameter b according to P1=b+c.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for integrated circuit (IC), comprising:
  receiving an IC layout having a plurality of features;
  determining pitches in the plurality of features;
  determining mask parameters and processing parameters based on the pitches in the features; and
  fabricating a mask according to the mask parameters.

2. The method of claim 1, further comprising fabricating a wafer according to the processing parameters and using the mask.

3. The method of claim 2, wherein
  the mask parameters include a width L and a spacing S defined in the features; and
  the processing parameters include a first thickness b of a first spacer material layer to be deposited on the wafer and a second thickness of a second spacer material layer to be deposited on the wafer.

4. The method of claim, 3, wherein the fabricating of the wafer includes
  depositing the first spacer material layer of the first thickness b; and
  performing a first anisotropic etch to the first spacer material layer, thereby forming a first spacer pattern.

5. The method of claim 3, wherein the fabricating of the wafer includes
  depositing a second spacer material layer of the second thickness; and
  performing a second anisotropic etch to the second spacer material layer, thereby forming a second spacer pattern.

6. A method for integrated circuit (IC), comprising:
  receiving an IC layout having a plurality of features having a first pitch P1 and a second pitch P2 being different from each other;
  determining a first processing parameter c according to P2=L−c, wherein L is a first width of the features; and
  determining a second processing parameter b according to P1=b+c.

7. The method of claim 6, further comprising fabricating a wafer that further includes:
  forming a mandrel pattern on the wafer according to the IC layout;
  depositing a first spacer material layer with a first thickness b;
  performing a first anisotropic etch to form a first spacer pattern on sidewalls of the mandrel pattern;
  removing the mandrel pattern;
  depositing a second spacer material layer with a second thickness c;
  performing a second anisotropic etch to form a second spacer pattern on sidewalls of the first spacer pattern;
  removing the first spacer pattern; and
  etching the wafer using the second spacer pattern as an etch mask.

8. A method for integrated circuit (IC), comprising:
  receiving an IC layout having an irregular pattern;
  determining a first (P1), second (P2), and third (P3) pitch from the irregular pattern wherein a first, second, and third subset of features of the irregular pattern conform to the first, second, and third pitch respectively;
  determining, from P1, P2, and P3, a width L and a spacing S of a mandrel pattern, a first thickness b of a first spacer pattern, and a second thickness c of a second spacer pattern, wherein the mandrel pattern, the first spacer pattern, and the second spacer pattern are to be used in a double patterning technique for forming the irregular pattern on a substrate and wherein the double patterning technique includes:
    forming the mandrel pattern on the substrate by a first lithography process,
    forming the first spacer pattern on sidewalls of the mandrel pattern,
    removing the mandrel pattern,
    forming the second spacer pattern on sidewalls of the first spacer pattern,
    removing the first spacer pattern, and
    etching the substrate using the second spacer pattern as an etch mask; and
  fabricating a mandrel mask using the mandrel pattern, wherein the mandrel mask is to be used in the first lithography process.

9. The method of claim 8, wherein the determining of L, S, b, and c from P1, P2, and P3 includes solving the following equations: P1=b+c, P2=L−c, and P3=S−2b−c.

10. The method of claim 8, further comprising:
  performing the double patterning technique with a wafer thereby forming the irregular pattern on the wafer.

11. The method of claim 8, wherein the double patterning technique further includes:
  forming a cut pattern on the second spacer pattern by a second lithography process; and removing portions of the second spacer pattern within openings of the cut pattern before the etching of the substrate.

12. The method of claim 11, wherein the determining of L, S, b, and c from P1, P2, and P3 includes solving the following equations: P1=b+c, P2=L−c, and P3=S+c.

13. The method of claim 11, wherein b and c are tuned to cause features of the second spacer pattern to merge and the cut pattern removes the merged portions of the second spacer pattern.

14. The method of claim 11, further comprising:
performing the double patterning technique on a wafer thereby forming the irregular pattern on the wafer.

15. The method of claim 11, wherein the determining of L, S, b, and c from P1, P2, and P3 includes adjusting S such that S<=2b+2c, further comprising:
adding a dummy feature to the irregular pattern, wherein the dummy feature is to be removed by the cut pattern.

16. The method of claim 8, wherein P1, P2, and P3 are different from each other.

17. The method of claim 8, wherein at least two of P1, P2, and P3 are the same.

* * * * *